US012598844B2

(12) United States Patent
Im et al.

(10) Patent No.:     US 12,598,844 B2
(45) Date of Patent:          Apr. 7, 2026

(54) LIGHT EMITTING DEVICE, PIXEL STRUCTURE COMPRISING LIGHT EMITTING DEVICE, AND MANUFACTURING METHOD THEREFOR

(71) Applicant: SAMSUNG DISPLAY CO., LTD., Yongin-si (KR)

(72) Inventors: Hyun Deok Im, Yongin-si (KR); Jong Hyuk Kang, Yongin-si (KR); Hyun Min Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 662 days.

(21) Appl. No.: 17/267,282

(22) PCT Filed: Feb. 13, 2019

(86) PCT No.: PCT/KR2019/001777
§ 371 (c)(1),
(2) Date: Feb. 9, 2021

(87) PCT Pub. No.: WO2020/036278
PCT Pub. Date: Feb. 20, 2020

(65)            Prior Publication Data
US 2021/0313494 A1      Oct. 7, 2021

(30)       Foreign Application Priority Data
Aug. 14, 2018    (KR) ........................ 10-2018-0095156

(51) Int. Cl.
*H10H 20/854*        (2025.01)
*H10H 20/01*         (2025.01)
*H10H 20/853*        (2025.01)

(52) U.S. Cl.
CPC ........ *H10H 20/854* (2025.01); *H10H 20/853* (2025.01); *H10H 20/0362* (2025.01)

(58) Field of Classification Search
CPC ... H01L 2933/005; H01L 33/62; H01L 33/44; H01L 33/02–24; H01L 33/26–346;
(Continued)

(56)            References Cited

U.S. PATENT DOCUMENTS 7,154,123 B2    12/2006  Kunisato et al.
7,704,771 B2     4/2010  Onushkin et al.
(Continued)

FOREIGN PATENT DOCUMENTS

CN        105378552        3/2016
CN        107610602        1/2018
(Continued)

OTHER PUBLICATIONS

International Search Report corresponding to International Application No. PCT/KR2019/001777 dated May 24, 2019.
(Continued)

*Primary Examiner* — Julio J Maldonado
*Assistant Examiner* — Eric Manuel Mulero Flores
(74) *Attorney, Agent, or Firm* — Womble Bond Dickinson (US) LLP

(57)            ABSTRACT

A light emitting device includes a first semiconductor layer, an active layer disposed on the first semiconductor layer, a second semiconductor layer disposed on the active layer, a first insulating film surrounding an outer surface of at least one layer from among the first semiconductor layer, the second semiconductor layer, and the active layer, and a second insulating film surrounding an outer surface of the first insulating film.

18 Claims, 16 Drawing Sheets

(58) Field of Classification Search
CPC . H01L 33/48–60; H01L 33/0054–0091; H01L
2933/0016–0066; H01L 33/52–56; H01L
23/562–576; H01L 33/36–42; H10H
20/83–835; H10H 20/032; H10H
29/832–8325; H10H 29/032; H10H
29/39; H10H 20/84–841; H10H 20/8508;
H10H 20/8504; H10H 20/852–854; H10H
20/831; H10H 20/8314; H10H 20/034;
H10H 20/016; H10H 20/857; H10H
29/034; H10H 29/842; H10H 20/8132;
H10H 20/8133; H10H 20/80; H10H
20/81; H10H 29/80–8323; H10K
50/805–828; H10K 2102/10–20
See application file for complete search history.

(56) References Cited

U.S. PATENT DOCUMENTS

| | | | |
|---|---|---|---|
| 9,112,112 B2 | 8/2015 | Do et al. | |
| 9,570,425 B2 | 2/2017 | Do | |
| 9,773,761 B2 | 9/2017 | Do | |
| 10,026,777 B2 | 7/2018 | Kang et al. | |
| 10,049,781 B2 | 8/2018 | Garcia et al. | |
| 10,461,123 B2 | 10/2019 | Kim et al. | |
| 10,672,946 B2 | 6/2020 | Cho et al. | |
| 10,818,647 B2 | 10/2020 | Kim et al. | |
| 2003/0010287 A1 | 1/2003 | Banno et al. | |
| 2008/0093614 A1* | 4/2008 | Nagai | H01L 33/505 |
| | | | 257/E33.061 |
| 2009/0315065 A1* | 12/2009 | Komada | H10H 20/833 |
| | | | 438/22 |
| 2012/0074434 A1* | 3/2012 | Park | H10H 20/8506 |
| | | | 257/E33.072 |
| 2014/0145237 A1* | 5/2014 | Do | H10H 20/813 |
| | | | 438/34 |
| 2014/0312369 A1* | 10/2014 | Yoon | H01L 33/44 |
| | | | 257/96 |
| 2014/0367633 A1* | 12/2014 | Bibl | H10K 59/38 |
| | | | 257/13 |
| 2016/0093773 A1* | 3/2016 | Sano | H10H 20/831 |
| | | | 438/26 |
| 2016/0133788 A1* | 5/2016 | Kim | H10H 20/819 |
| | | | 257/79 |
| 2017/0141260 A1* | 5/2017 | Chen | H10H 20/841 |
| 2017/0141279 A1* | 5/2017 | Do | B23K 26/00 |
| 2017/0229482 A1* | 8/2017 | Chen | H10D 86/60 |
| 2017/0352646 A1* | 12/2017 | Bower | H01L 25/167 |
| 2018/0012876 A1 | 1/2018 | Kim et al. | |
| 2018/0233640 A1* | 8/2018 | Kawai | H01L 25/167 |

FOREIGN PATENT DOCUMENTS

| | | |
|---|---|---|
| CN | 107611153 | 1/2018 |
| CN | 108206228 | 6/2018 |
| JP | 2008-235883 | 10/2008 |
| JP | 4368225 | 11/2009 |
| JP | 5336031 | 11/2013 |
| KR | 10-1140096 | 4/2012 |
| KR | 10-1172824 | 8/2012 |
| KR | 10-2012-0122159 | 11/2012 |
| KR | 10-1436123 | 11/2014 |
| KR | 10-2015-0006798 | 1/2015 |
| KR | 10-2018-0007025 | 1/2018 |
| KR | 10-2018-0055021 | 5/2018 |
| KR | 10-2018-0072909 | 7/2018 |
| WO | 2004/032193 | 4/2004 |
| WO | 2006/076209 | 7/2006 |

OTHER PUBLICATIONS

Written Opinion, with English translation, corresponding to International Application No. PCT/KR2019/001777, dated May 24, 2019.

Korean Notice of Allowance for Korean Patent Application No. 10-2018-0095156, dated Oct. 27, 2023.

* cited by examiner

FIG. 7

LIGHT EMITTING DEVICE, PIXEL STRUCTURE COMPRISING LIGHT EMITTING DEVICE, AND MANUFACTURING METHOD THEREFOR

CROSS REFERENCE TO RELATED APPLICATION(S)

This application is a national entry of International Application No. PCT/KR2019/001777, filed on Feb. 13, 2019, which claims under 35 U.S.C. §§ 119 (a) and 365 (*b*) priority to and benefits of Korean Patent Application No. 10-2018-0095156, filed on Aug. 14, 2018 in the Korean Intellectual Property Office (KIPO), the entire contents of all of which are incorporated herein by reference.

BACKGROUND

1. Technical Field

The present disclosure relates to a light emitting element, a pixel structure including the light emitting element, and a method of manufacturing the pixel structure.

2. Description of the Related Art

A light emitting diode (LED) may have relatively satisfactory durability even under poor environmental conditions and may have excellent performances in terms of lifetime and luminance. Recently, research on the technology of applying the light emitting element to various light emitting devices has become appreciably more active.

As a part of such research, the technology of fabricating a light emitting element having a small size corresponding to a microscale or nanoscale size using an inorganic crystalline structure, e.g., a structure obtained by growing a nitride-based semiconductor is being developed. For example, the subminiature light emitting element may be fabricated in a small size enough to form a pixel of a self-emissive display panel, etc.

The light emitting element may be disposed between electrodes by directly growing the light emitting element on an electrode or by separately and independently growing the light emitting element and then disposing it on an electrode. After the light emitting element is disposed, the electrode and the light emitting element are electrically connected via a separately provided coupling electrode. As the size of the light emitting element decreases to nanoscale, there is a high possibility that electrical connections fail because of the high level of difficulty in the process.

SUMMARY

Various embodiments of the present disclosure are directed to a light emitting element, a pixel structure including the light emitting element, and a method of manufacturing the pixel structure, in which an organic insulating film is formed on an outer surface of the light emitting element to be modified into hydrophobicity by a chemical reaction.

Other embodiments of the present disclosure are directed to a method of manufacturing a pixel structure, in which only an organic layer is selectively subjected to hydrophobic treatment through surface treatment after a light emitting element is aligned, thus allowing a coupling electrode to be formed only in a desired area.

According to an aspect of the present disclosure, a light emitting device may include a first semiconductor layer; an active layer disposed on the first semiconductor layer; a second semiconductor layer disposed on the active layer; a first insulating film surrounding an outer surface of at least one of the first semiconductor layer, the second semiconductor layer, and the active layer; and a second insulating film surrounding an outer surface of the first insulating film.

The second insulating film may include an organic polymer material.

The light emitting device may further include a hydrophobic layer disposed on at least a portion of a surface of the second insulating film.

The second insulating film may include at least one of polypropylene (PP), polystyrene (PS), polymethylmethacrylate (PMMA), polyethene (PE), polyamide (PA), polyester, and polytetrafluoroethene (PTFE).

Furthermore, the light emitting device may further include at least one of a first electrode, and a second electrode facing the first electrode. The first semiconductor layer may be interposed between the first electrode and the active layer, and the second semiconductor layer may be interposed between the second electrode and the active layer.

According to an aspect of the present disclosure, a pixel structure may include a substrate; an electrode component including a first electrode disposed on the substrate, and a second electrode disposed on a same plane as the first electrode to be spaced apart therefrom; a light emitting device aligned between the first electrode and the second electrode; and a coupling electrode component including a first coupling electrode that is disposed on the first electrode and electrically connects a first end of the light emitting device with the first electrode; and a second coupling electrode that is disposed on the second electrode and electrically connects a second end of the light emitting device with the second electrode. The light emitting device may include a first semiconductor layer; an active layer disposed on the first semiconductor layer; a second semiconductor layer disposed on the active layer; a first insulating film surrounding an outer surface of at least one of the first semiconductor layer, the second semiconductor layer, and the active layer; and a second insulating film surrounding an outer surface of the first insulating film.

The pixel structure may further include a first hydrophobic layer disposed on an exposed surface of the second insulating film of the light emitting device.

The pixel structure may further include an organic layer disposed on the light emitting device.

The pixel structure may further include a second hydrophobic layer disposed on a surface of the organic layer.

The pixel structure may further include a dam structure disposed outside the first electrode and the second electrode, and including an organic material.

The pixel structure may further include a third hydrophobic layer disposed on a surface of the dam structure.

The first coupling electrode and the second coupling electrode may be disposed in an area where the first, second, and third hydrophobic layers are not disposed.

The pixel structure may further include an insulating layer disposed between the substrate and the light emitting device and including an inorganic material.

According to an aspect of the present disclosure, a method of manufacturing a pixel structure may include forming a first electrode and a second electrode on a substrate to be spaced apart from each other; forming a dam structure outside the first and second electrodes, the dam structure being formed of organic material; forming an insulating layer on the first and second electrodes, the insulating layer being formed of inorganic material; aligning a light emitting device between the first electrode and the second electrode; plasma-treating the substrate on which the light emitting device is aligned to generate a plasma-treated substrate; removing at least a portion of the insulating layer; and forming a first coupling electrode and a second coupling electrode that electrically connect the light emitting device to the first electrode and the second electrode, respectively.

The light emitting device may include a first semiconductor layer; an active layer disposed on the first semiconductor layer; a second semiconductor layer disposed on the active layer; a first insulating film surrounding an outer surface of at least one of the first semiconductor layer, the second semiconductor layer, and the active layer; and a second insulating film surrounding an outer surface of the first insulating film. A first hydrophobic layer may be formed on an exposed surface of the second insulating film by the plasma treatment.

A third hydrophobic layer may be formed on a surface of the dam structure by the plasma treatment.

In the performing of the plasma treatment, a gas containing fluorine may be used.

The method may further include forming an organic layer on the light emitting device after the aligning of the light emitting device.

A second hydrophobic layer may be formed on a surface of the organic layer by the plasma treatment.

The forming of the first coupling electrode and the second coupling electrode may include applying metal paste on the plasma-treated substrate; and drying the metal paste, wherein the metal paste may not be compatible with the first, second, and third hydrophobic layers, and may be applied to an area in which the first, second, and third hydrophobic layers are not formed.

A light emitting element, a pixel structure including the light emitting element, and a method of manufacturing the pixel structure in accordance with the present disclosure can reduce a failure rate in case that electrical coupling is made between an electrode and a light emitting element, in the manufacture of the pixel structure using a subminiature light emitting element.

BRIEF DESCRIPTION OF THE DRAWINGS

FIG. 7 is a schematic plan view conceptually illustrating a display device including a pixel structure in accordance with an embodiment of the present disclosure.

DETAILED DESCRIPTION OF THE EMBODIMENTS

Figure 1:
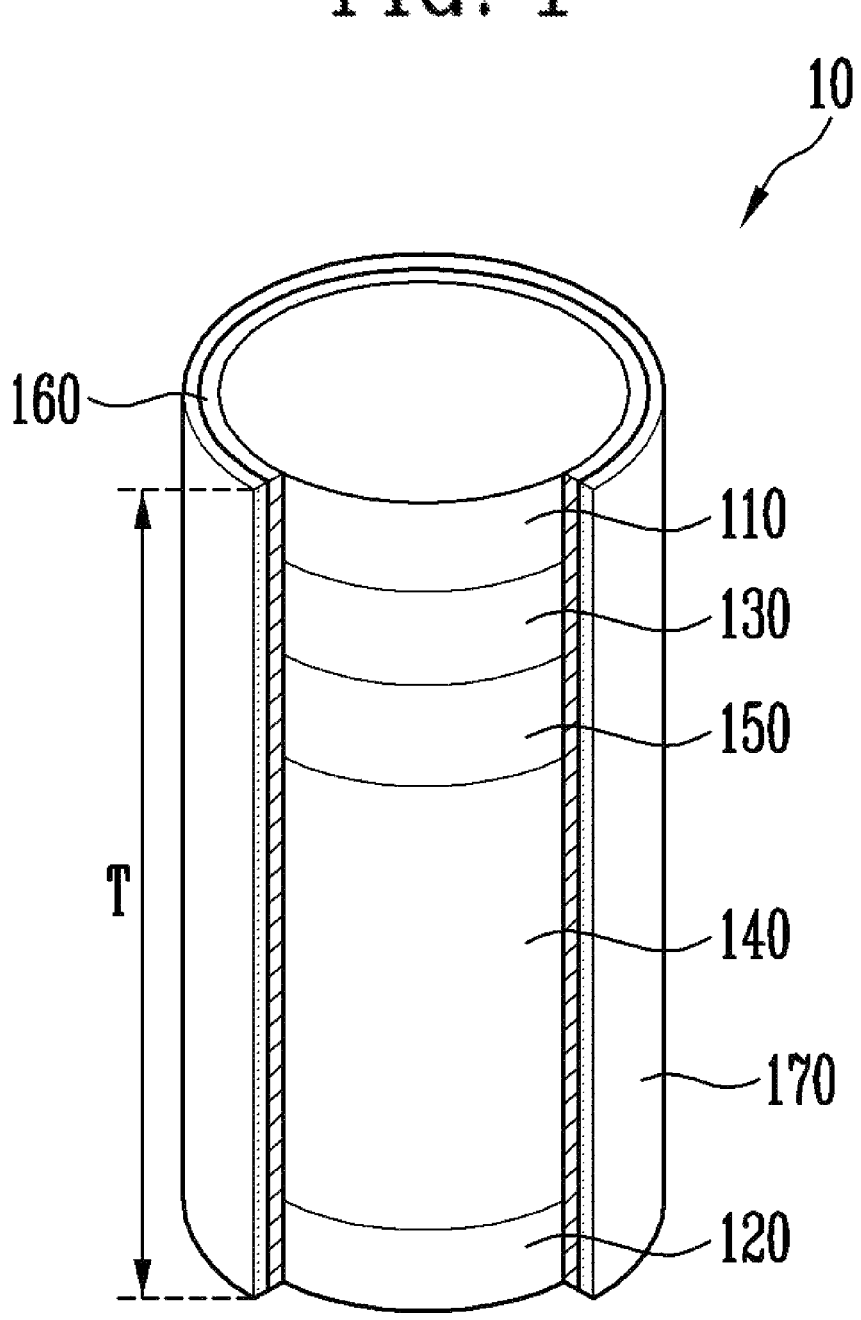
FIG. 1 is a schematic perspective view of a light emitting element in accordance with an embodiment of the present disclosure.

While the present disclosure allows for various changes and numerous embodiments, some embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure.

Throughout the disclosure, like reference numerals refer to like parts throughout the various figures and embodiments of the present disclosure. The sizes of elements in the accompanying drawings may be exaggerated for clarity of illustration. It will be understood that, although the terms "first," "second," or the like may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element. In the present disclosure, the singular forms are intended to include the plural forms as well unless the context clearly indicates otherwise.

It will be further understood that the terms "comprise," "include," etc., when used in this specification, specify presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, a region, or a plate is formed or disposed on a second part, the first part may be directly on the second part or a third part may intervene between them. In addition, when it is expressed that a first part such as a layer, a film, a region, or a plate is formed or disposed on a second part, the surface of the second part on which the first part is formed is not limited to an upper surface of the second part but may include other surfaces such as a side surface or a lower surface of the second part. To the contrary, when a first part such as a layer, a film, a region, or a plate is under a second part, the first part may be directly under the second part or a third part may intervene between them.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

In the specification and the claims, the phrase "at least one of" is intended to include the meaning of "at least one selected from the group of" for the purpose of its meaning and interpretation. For example, "at least one of A and B" may be understood to mean "A, B, or A and B."

Hereinafter, a light emitting element, a pixel structure including the light emitting element, and a method of manufacturing the pixel structure in accordance with an embodiment of the present disclosure will be described with reference to the accompanying drawings.

FIG. 1 is a schematic perspective view of a light emitting element in accordance with an embodiment of the present disclosure.

The light emitting element 10 (or light emitting device) is an LED element that may emit light and may be formed in a rod-like shape and a bar-like shape such as a cylindrical shape and a prismatic shape extending in the longitudinal direction (i.e., to have an aspect ratio greater than 1), for example. As illustrated in FIG. 1, the subminiature light emitting element 10 in accordance with an embodiment of the present disclosure may include a first electrode layer 110, a second electrode layer 120, a first semiconductor layer 130, a second semiconductor layer 140, and an active layer 150 disposed between the first and second semiconductor layers 130 and 140. For example, the first electrode layer 110, the first semiconductor layer 130, the active layer 150, the second semiconductor layer 140, and the second electrode layer 120 may be sequentially stacked in the longitudinal direction of the light emitting element 10. For example, a length T of the subminiature light emitting element 10 may range from about 2 μm to about 5 μm, but the present disclosure is not limited thereto.

Each of the first and second electrode layers 110 and 120 may be an ohmic contact electrode. However, each of the first and second electrode layers 110 and 120 is not limited thereto and may be a Schottky contract electrode. Each of the first and second electrode layers 110 and 120 may include conductive metal. For example, each of the first and second electrode layers 110 and 120 may include one or more metal materials selected from a group consisting of aluminum, titanium, indium, gold, and silver. As an example, materials included in the first and second electrode layers 110 and 120 may be identical to each other. As another example, materials included in the first and second electrode layers 110 and 120 may be different from each other.

The first electrode layer 110 as the ohmic contact electrode may not be an essential component. In this case, the first semiconductor layer 130 may be directly connected to a first electrode 31 of the pixel structure 1 that will be described below. The second electrode layer 120 as the ohmic contact electrode may not be an essential component. In this case, the second semiconductor layer 140 may be directly connected to a second electrode 32 of the pixel structure 1 that will be described below.

The first semiconductor layer 130 in accordance with an embodiment of the present disclosure may be an electron transport layer, and may include, for example, a p-type semiconductor layer. For instance, in case that the light emitting element 10 is a blue light emitting element, the p-type semiconductor layer may be a semiconductor material having a composition formula of In Al, Gal-x-N(0≤x≤1, 0≤y≤1, 0x+y≤1), may be selected from any one of InAlGaN, GaN, AlGaN, InGaN, AlN, InN, etc., for example, and may be doped with a second conductive dopant (e.g. Mg).

The second semiconductor layer 140 in accordance with an embodiment of the present disclosure may be a hole transport layer, and may include, for example, a n-type semiconductor layer. For instance, when the light emitting element 10 is a blue light emitting element, the n-type semiconductor layer may be a semiconductor material having a composition formula of $In_xAl$, $Ga_{1-x-y}N(0≤x≤1, 0≤y≤1, 0x+y≤1)$, may be selected from any one of InAlGaN, GaN, AlGaN, InGaN, AlN, InN, etc., for example, and may be doped with a first conductive dopant (e.g. Si, Ge, Sn, etc.). The light emitting element 10 is not limited to the blue light emitting element and may include different kinds of group III-V semiconductor materials as the n-type semiconductor layer in case that an emission color is different.

The active layer 150 as the light emitting layer may be disposed between the first and second semiconductor layers 130 and 140 and may be formed as a single or multi quantum well structure, for example. For instance, a clad layer (not shown) doped with a conductive dopant may be disposed above and/or below (or on and/or under) the active layer 150. The clad layer (not shown) doped with the conductive dopant may be formed as an AlGaN layer or an InAlGaN layer. Material such as AlGaN or AlInGaN may be employed to form the active layer 150.

In case that an electric field is applied to the active layer 150, light may be generated by the combination of electron-hole pairs. A position of the active layer 150 may be variously changed depending on the type of light emitting element. In an embodiment, the active layer 150 may be disposed at a position such that a ratio of a length between the first electrode layer 110 and the first semiconductor layer 130 to a length between the second electrode layer 120 and the second semiconductor layer 140 is one-to-twenty (1:20). The light emitting element 10 is not limited to the blue light emitting element and may include different kinds of group III-V semiconductor materials in the active layer 150 in case that an emission color is different.

Although it has been described that the first and second semiconductor layers 130 and 140 and the active layer 150 may be included in the light emitting element 10, the embodiments of the present disclosure are not limited thereto. For instance, the light emitting element 10 may further include a separate fluorescent layer, active layer, semiconductor layer, and/or electrode layer above and/or below (or on and/or under) the first and second semiconductor layers 130 and 140.

The light emitting element 10 may further include a first insulating film 160 that covers an outer surface of the active layer 150. For instance, the first insulating film 160 may cover a side surface of the active layer 150. Thus, it is possible to prevent an electric short circuit that may occur in case that the active layer 150 comes into contact with the first electrode 31 or the second electrode 32 of the pixel structure 1. The first insulating film 160 may protect an outer surface including the active layer 150 of the light emitting element 10 to prevent the luminous efficiency from deteriorating. In various embodiments of the present disclosure, the first insulating film 160 may be an inorganic layer. For example, the first insulating film 160 may include at least one insulating material selected from a group consisting of $SiO_2$, $Si_3N_4$, $Al_2O_3$, and $TiO_2$, but is not limited thereto. In other words, various materials having insulating properties may be employed.

In various embodiments of the present disclosure, the light emitting element 10 may further include a second insulating film 170 that covers an outer surface of the first insulating film 160. In various embodiments of the present disclosure, the second insulating film 170 may be an organic layer. The second insulating film 170 may be made of material such as polypropylene (PP), polystyrene (PS), polymethylmethacrylate (PMMA), polyethene (PE), polyamide (PA), polyester, or polytetrafluoroethene (PTFE), for example. However, embodiments of the present disclosure are not limited thereto. The second insulating film 170 is material that may be at least partially transformed into hydrophobicity by reacting with fluorine and may be made of organic polymer material including polymer.

Figure 2A:
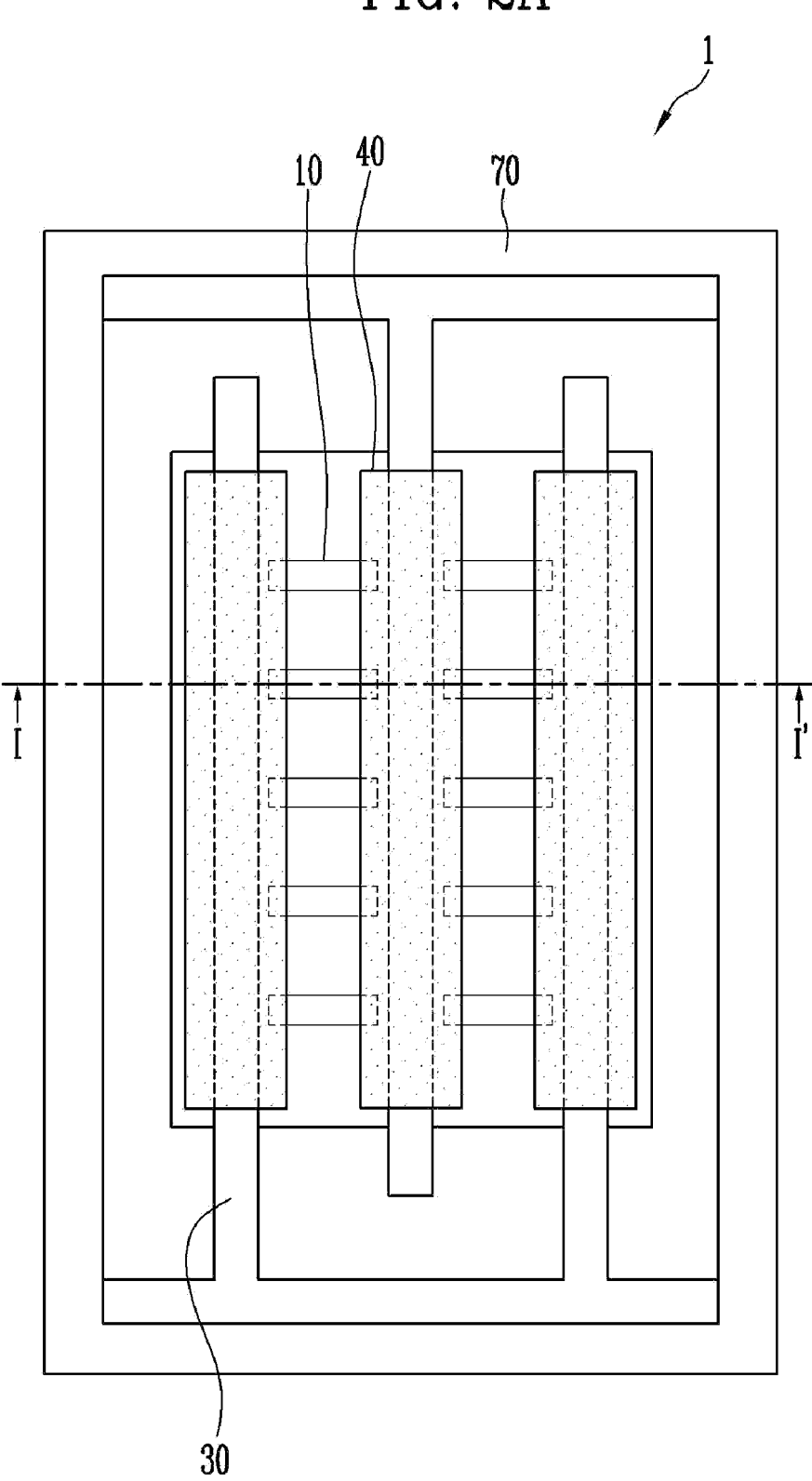
FIGS. 2A and 2B are schematic plan views illustrating a pixel structure in accordance with an embodiment of the present disclosure.
Figure 2B:
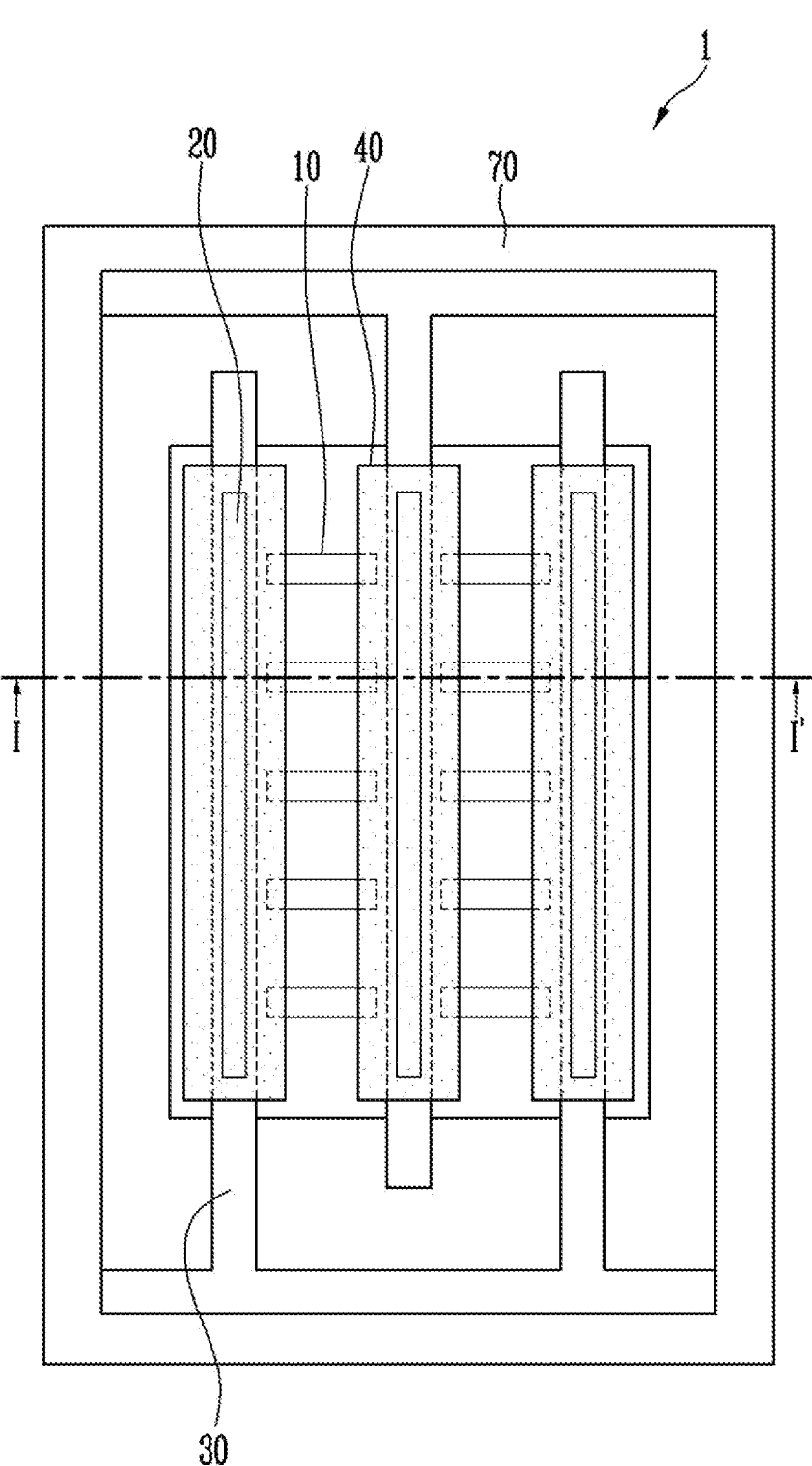
Figure 3A:
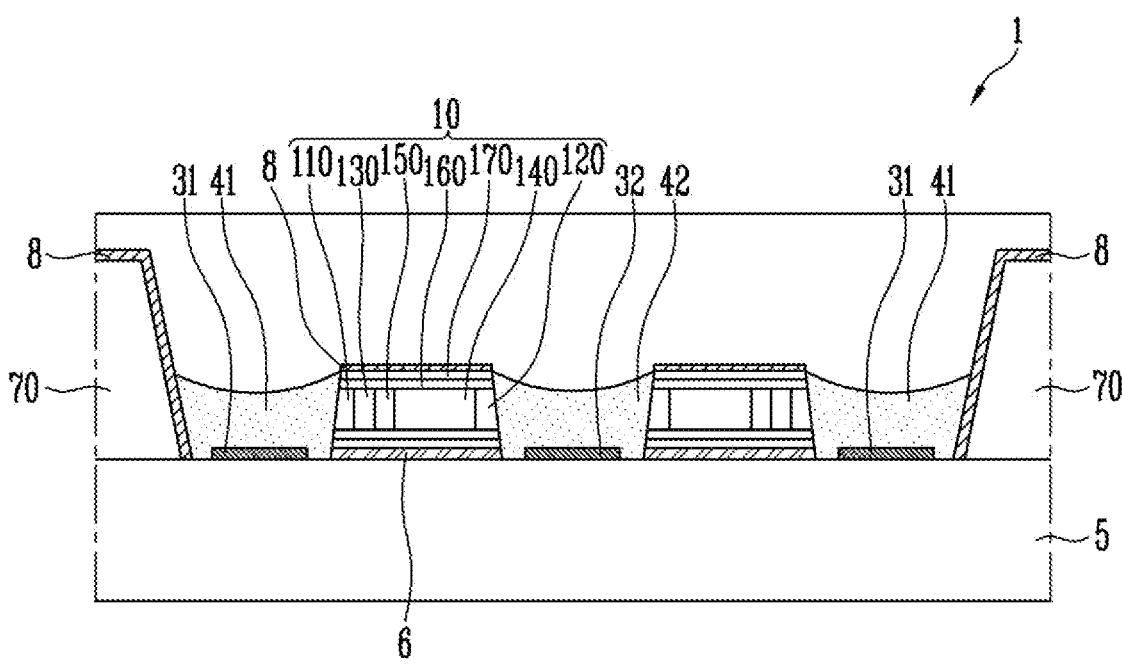
FIGS. 3A and 3B are schematic cross-sectional views of the pixel structure taken along line I-I' of FIGS. 2A and 2B.
Figure 3B:
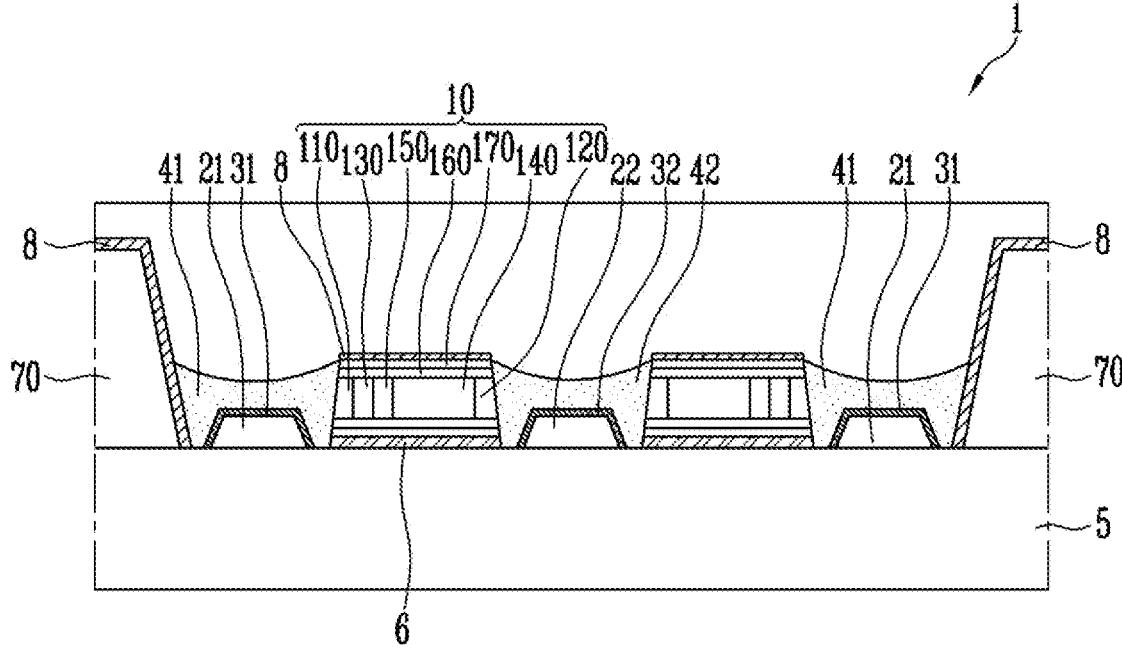

FIGS. 2A and 2B are schematic plan views illustrating a pixel structure in accordance with an embodiment of the present disclosure, and FIGS. 3A and 3B are schematic cross-sectional views of the pixel structure taken along line I-I' of FIGS. 2A and 2B.

Referring to FIG. 2A, the pixel structure 1 may include an electrode component 30, a light emitting element 10, and a coupling electrode component 40 that electrically connects the electrode component 30 with the light emitting element 10. The pixel structure 1 may further include a dam structure 70 that is disposed outside the electrode component 30. The pixel structure 1 may be provided with electrode components 30 and coupling electrode components 40. Multiple pixel structures 1 may be disposed on a display device 1000 of the present disclosure that will be described below.

Referring to FIGS. 2A and 3A, a first electrode 31 and a second electrode 32 forming (or constituting) the electrode component 30 may be formed on a substrate 5 to be on the same plane or layer and may be spaced apart from each other by a predetermined distance.

The substrate 5 may be any one of a glass substrate, a crystal substrate, a sapphire substrate, a plastic substrate, and a flexible polymer film that may be bent, but the present disclosure is not limited thereto.

As illustrated in FIG. 3A, each of the first electrode 31 and the second electrode 32 may be formed in a rectangular shape. However, embodiments of the present disclosure are not limited thereto. Each of the first electrode 31 and the second electrode 32 may have any of various shapes such as a trapezoid inclined at a predetermined angle, a semi-circle, a semi-ellipse, and a circle. In various embodiments of the present disclosure, one of the first and second electrodes 31 and 32 may be an anode electrode, while the other may be a cathode electrode.

The first and second electrodes 31 and 32 perform the function of aligning the light emitting elements 10 in the manufacturing process of the pixel structure 1 and the function of applying an electric signal to the light emitting element 10 in the completed pixel structure 1. The specific alignment function of the first and second electrodes 31 and 32 will be described below in detail with reference to the method of manufacturing the pixel structure 1.

The first and second electrodes 31 and 32 may be made of a conductive material having a predetermined reflectivity. The conductive material may include metal such as Ag, Mg, Al, Pt, Pd, Au, Ni, Nd, Ir, Cr, or an alloy of them, a conductive oxide such as an indium tin oxide (ITO), an indium zinc oxide (IZO), a zinc oxide (ZnO), or an indium tin zinc oxide (ITZO), and a conductive polymer such as PEDOT. Each of the first and second electrodes 31 and 32 may have a single-layer structure, but it is not limited to this, and it may have a multi-layer structure formed by stacking two or more materials of metals, alloys, conductive oxides, and conductive polymers.

Each of the first and second electrodes 31 and 32 may cause light emitted from both ends of the light emitting element 10 to proceed in a direction in which an image is displayed (e.g., a front direction).

In an embodiment, a component for driving the pixel structure 1 as a passive matrix or an active matrix may be further provided between the first and second electrodes 31 and 32 and the substrate 5. For example, in case that the pixel structure 1 is driven as the active matrix, signal lines may be provided between the first and second electrodes 31 and 32 and the substrate 5. The signal lines may include scan lines and data lines. A thin film transistor may be electrically connected to the signal lines and may include a gate electrode, a semiconductor pattern, a source electrode, and a drain electrode. The drain electrode may be electrically connected to one of the first and second electrodes 31 and 32, and a data signal of the data line may be applied to any one of reflective electrodes through the thin film transistor. Here, signal lines, insulating layers, and/or thin film transistors may be naturally provided in various numbers and shapes. This will be described below with reference to FIGS. 7 to 9.

The light emitting element 10 is disposed between the first electrode 31 and the second electrode 32. In an embodiment, the light emitting element 10 has a length shorter than a distance between the first electrode 31 and the second electrode 32. Since the length of the light emitting element 10 is shorter than the distance between the first and second electrodes 31 and 32, both ends of the light emitting element 10 may not simultaneously come into direct contact with the first and second electrodes 31 and 32. As such, since both ends of the light emitting element 10 may not come into direct contact with the first and second electrodes 31 and 32, the pixel structure I may not apply high voltage to the light emitting element 10 even if the high voltage is applied to the first and second electrodes 31 and 32 so as to align the light emitting element 10 in the manufacturing process of the pixel structure 1. Thus, it is possible to prevent damage to a subminiature light element or damage to the first and second electrodes 31 and 32, which is a problem that occurs in case that high voltage is applied to the light emitting element 10.

The specific structure of the light emitting element 10 has been described above with reference to FIG. 1.

In various embodiments of the present disclosure, at least a portion of the second insulating film 170 of the light emitting element 10 may be modified to have hydrophobicity, thus forming a hydrophobic layer 8 (referred to as a first hydrophobic layer).

The insulating layer 6 may be disposed below (or under) the light emitting element 10. The insulating layer 6 is formed of an inorganic layer such as silicon oxide, silicon nitride, or metal oxide, and has hydrophilicity. The insulating layer 6 may be formed during a process for aligning the light emitting element 10. This will be described below in detail with reference to the method of manufacturing the pixel structure 1.

The coupling electrode component 40 includes a first coupling electrode 41 electrically connecting the light emitting element 10 with the first electrode 31, and a second coupling electrode 42 stably connecting the light emitting element 10 with the second electrode 32. The first coupling electrode 41 electrically contacts and connects the first electrode layer 110 of the subminiature light emitting element 30 with the first electrode 31, while the second coupling electrode 42 electrically contacts and connects the second electrode layer 120 of the subminiature light emitting element 30 with the second electrode 22.

The first and second coupling electrodes 41 and 42 may be made of a transparent conductive material so that light emitted from each of the light emitting elements 10 and reflected in the front direction by the first and second electrodes 31 and 32 proceeds without loss. For example, the transparent conductive material may include ITO, IZO, ITZO, etc.

The dam structure 70 may be disposed outside the first and second electrodes 31 and 32. The dam structure 70 may be formed to be higher than the height of the first and second electrodes 31 and 32. The dam structure 70 may prevent solution containing light emitting elements 10 or metal paste 200 for forming the coupling electrode component 40 from shifting to an undesired area in the process of manufacturing the pixel structure 1.

The dam structure 70 may be made of organic matter as a material capable of maintaining a predetermined thickness. For example, the dam structure 70 may be made of polyimide, but is not limited thereto.

In various embodiments of the present disclosure, a hydrophobic layer 8 (referred to as a third hydrophobic layer 8) may be formed above (or on) the light emitting element 10 and the dam structure 70. The hydrophobic layer 8 may be formed by treating the surface of the pixel structure 1 during a process and then chemically modifying a portion of surfaces of the second insulating film 170 of the light emitting element 10 and the dam structure 70.

The surface treatment may be plasma treatment that applies a fluorine-containing gas, for example, CxFx-based gas, to the surface of the pixel structure 1 during the process and then chemically modifies a portion of the surface to have hydrophobicity. The CxFx-based gas may be, for example, carbon tetrafluoride (CF4). Fluorine contained in the gas may chemically react with an organic polymer (C—H$_2$ bond) to modify the organic matter into hydrophobicity (C-F$_2$ bond). A portion of surfaces of the second insulating film 170 of the light emitting element 10 and the dam structure 70 made of an organic polymer may be selectively plasma-treated by the surface treatment to form the hydrophobic layer 8.

In various embodiments, at least one insulating layer and/or an overcoat layer OC may be provided on the first and second coupling electrodes 41 and 42. The insulating layer and/or the overcoat layer OC may be a flattening layer that reduces a height difference caused by the electrode component 30, the light emitting element 10, and the coupling electrode component 40 that are disposed therebelow. The insulating layer and/or the overcoat layer OC may be an encapsulation layer to prevent oxygen and moisture from penetrating into the light emitting elements 10.

In various embodiments of the present disclosure, the pixel structure 1 may include a party wall component 20 as illustrated in FIGS. 2B and 3B.

Referring to FIGS. 2B and 3B, a first party wall 21 and a second party wall 22 forming the party wall component 20 may be provided on the substrate 5. The first party wall 21 and the second partition wall 22 may be formed on the substrate 5 to be on the same plane or layer and be spaced apart from each other by a predetermined distance, and may be made of an insulating material.

As illustrated in FIG. 2B, each of the first and second party walls 21 and 22 may have a trapezoidal shape in which side surfaces thereof are inclined at a predetermined angle. However, embodiments of the present disclosure are not limited thereto. Each of the first party wall 21 and the second party wall 22 may have any of various shapes such as a semi-circle, a semi-ellipse, a circle, or a rectangle.

In this embodiment, the first electrode 31 and the second electrode 32 are provided on the first party wall 21 and the second party wall 22, respectively. The first electrode 31 and the second electrode 32 have shapes corresponding to those of the first party wall 21 and the second party wall 22, respectively. Since the first electrode 31 and the second electrode 32 have the shapes corresponding to those of the first party wall 21 and the second party wall 22, respectively, light emitted from both ends of each light emitting element 10 may be reflected by the first and second electrodes 31 and 32 and then may further proceed in the front direction. Therefore, the efficiency of light emitted from the light emitting element 10 may be enhanced. In this embodiment, the first and second party walls 21 and 22, along with the first and second electrodes 31 and 32 provided on the first and second party walls, may function as reflective members for enhancing the efficiency of light emitted from each light emitting element 10.

Figure 4A:
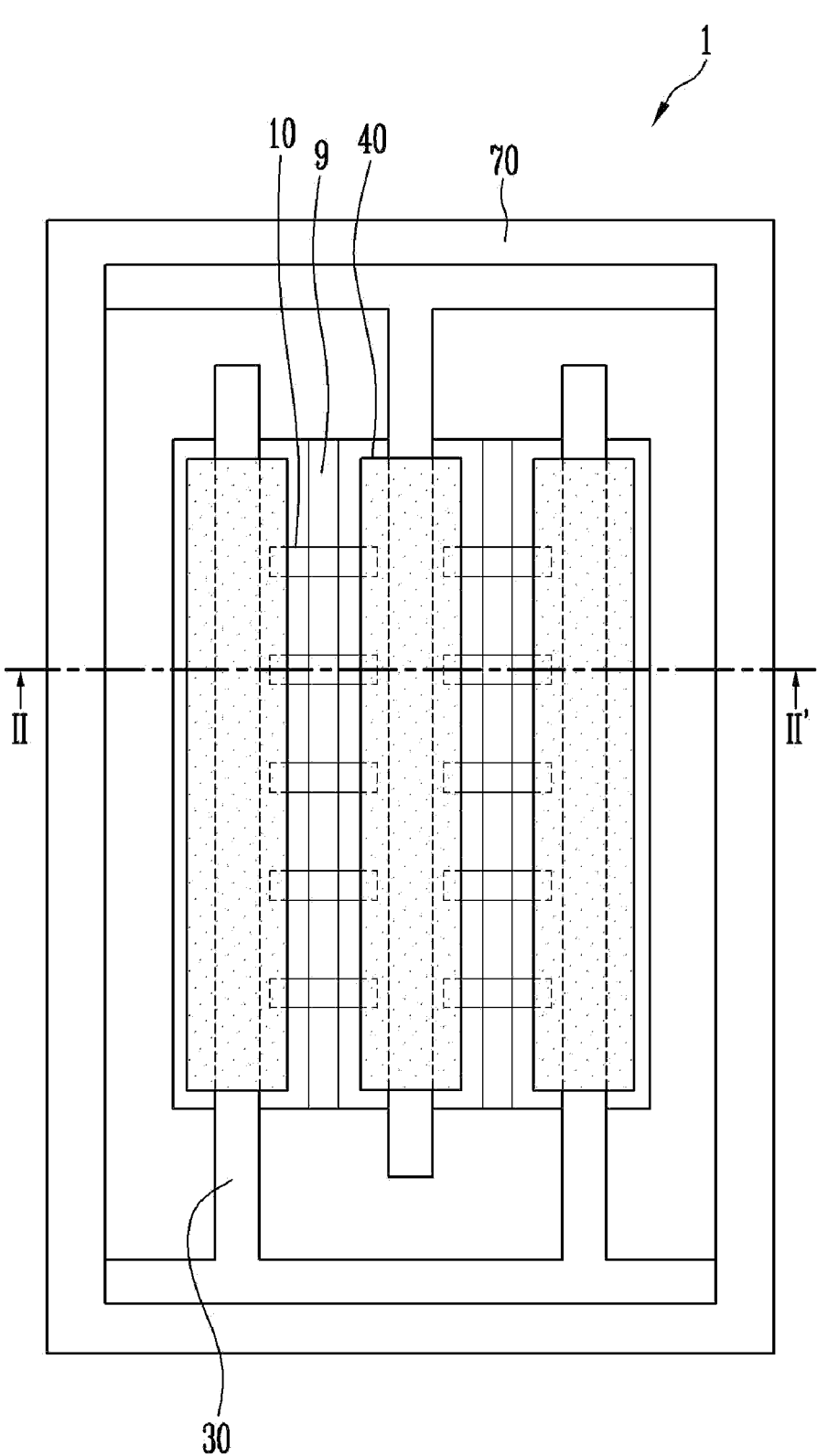
FIGS. 4A and 4B are schematic plan views illustrating a pixel structure in accordance with another embodiment of the present disclosure.
Figure 4B:
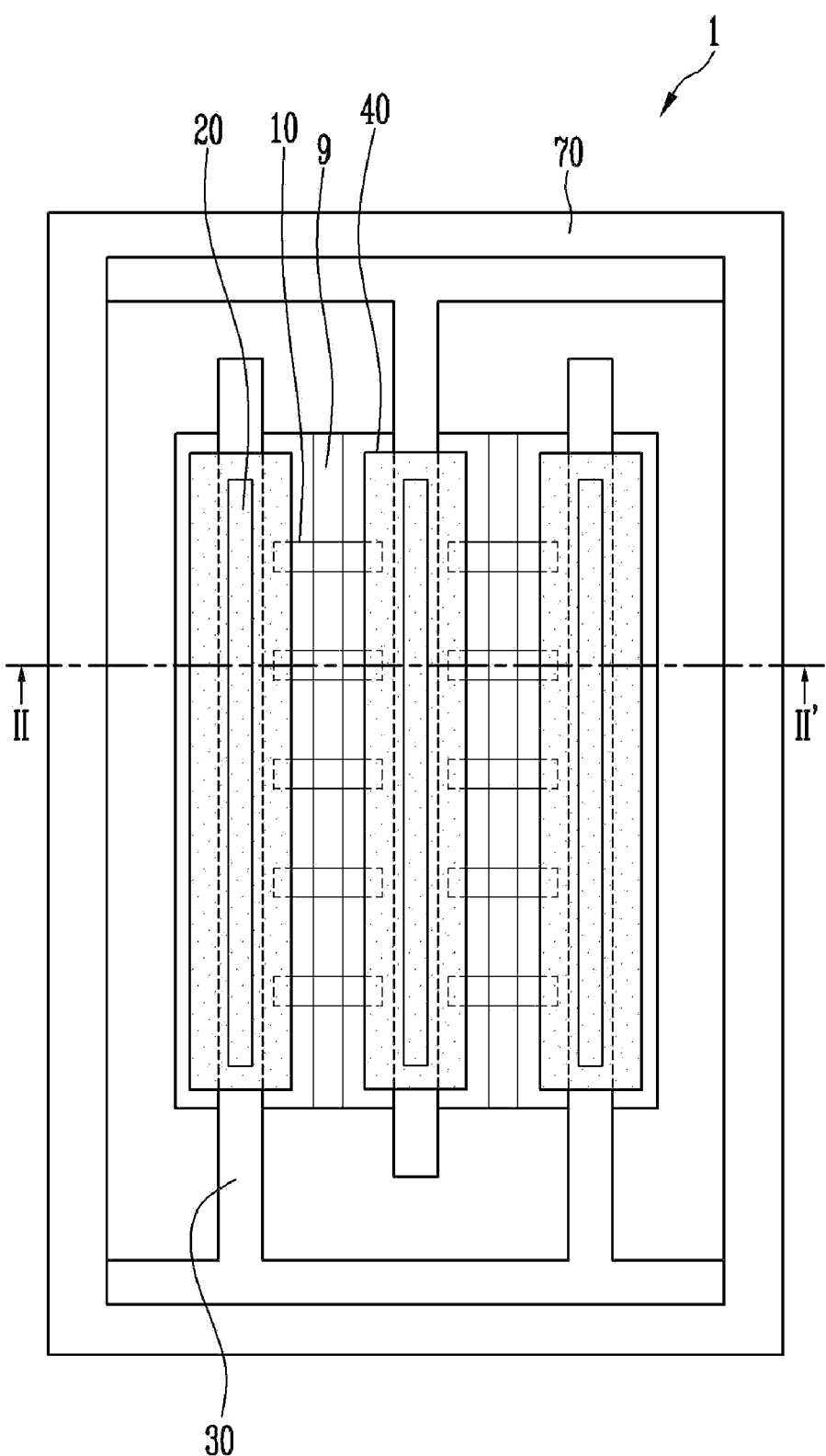
Figure 5A:
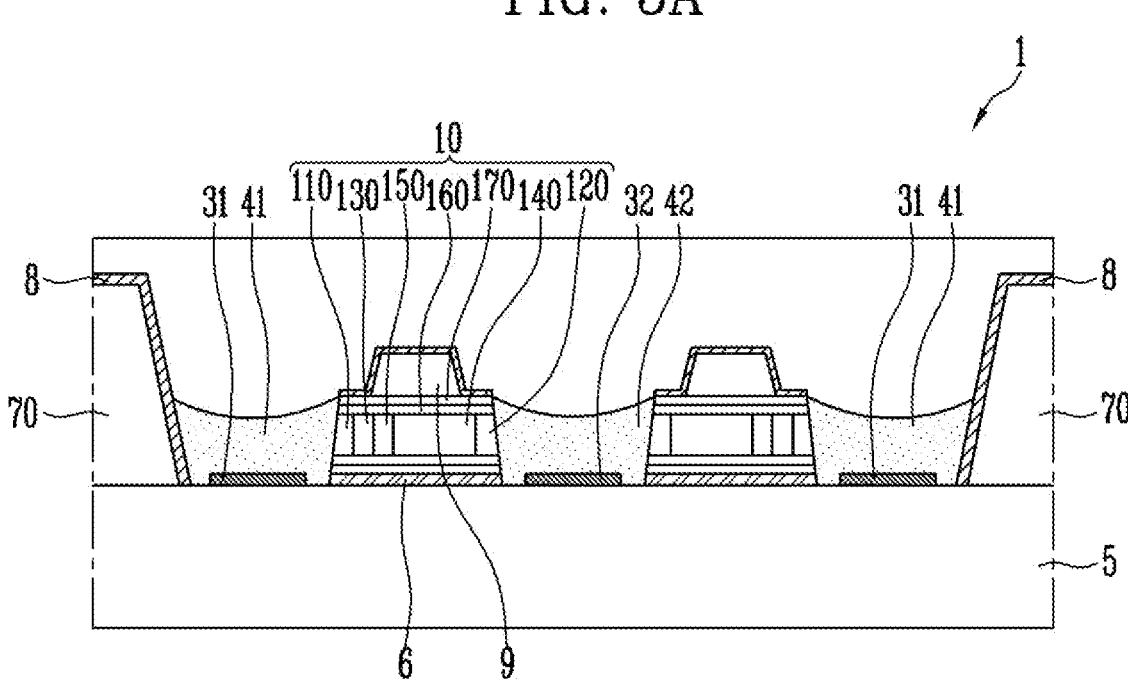
FIGS. 5A and 5B are schematic cross-sectional views of the pixel structure taken along line II-II' of FIGS. 4A and 4B.
Figure 5B:
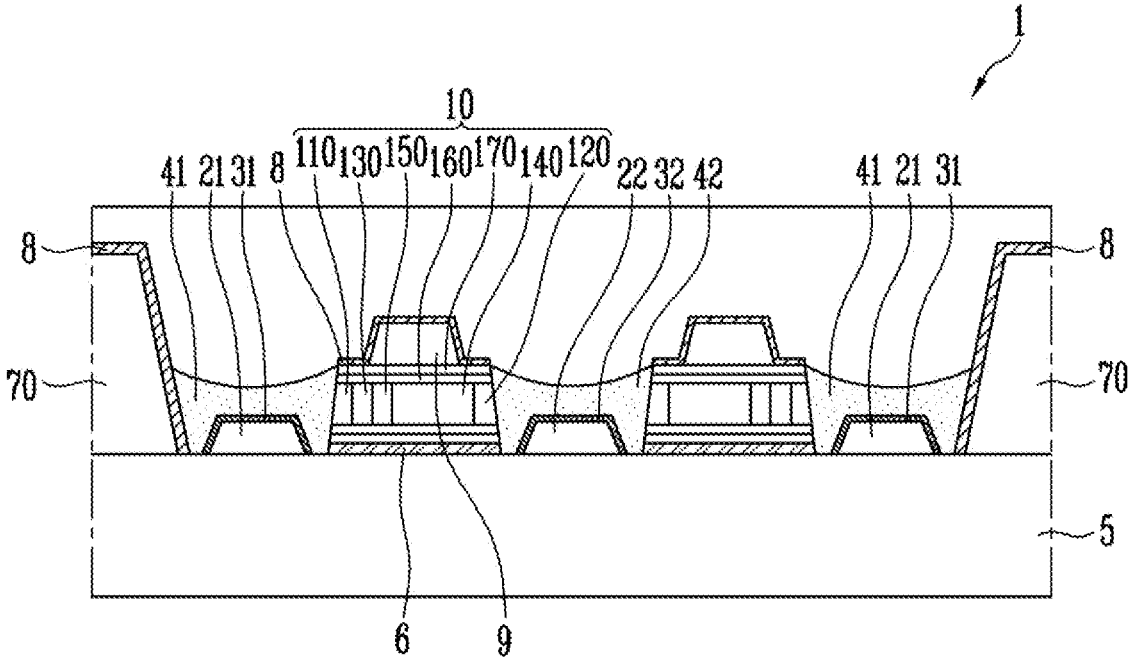

FIGS. 4A and 4B are schematic plan views illustrating a pixel structure in accordance with another embodiment of the present disclosure, and FIGS. 5A and 5B are sectional cross-sectional views of the pixel structure taken along line II-II' of FIGS. 4A and 4B.

Referring to FIGS. 4A and 5A, the pixel structure 1 may further include an organic layer 9 formed on the light emitting element 10 as compared with the embodiment of FIGS. 2A and 3A. The organic layer 9 may be made of organic material such as polypropylene (PP), polystyrene (PS), polymethylmethacrylate (PMMA), polyethene (PE), polyamide (PA), polyester, or polytetrafluoroethene (PTFE), for example. Thus, a portion of a surface of the organic layer 9 may be converted into hydrophobicity by the above-described surface treatment to form a hydrophobic layer 8 (referred to as a second hydrophobic layer).

The organic layer 9 forms the hydrophobic layer 8, thus preventing the metal paste 200 for forming the coupling electrode component 40 from passing the light emitting element 10 and being connected across the left and right sides of the light emitting element 10, in the process of manufacturing the pixel structure 1. In other words, the metal paste 200 for forming the coupling electrode component 40 may be completely separated into the left and right sides of the light emitting element 10, by the organic layer 9 formed on the light emitting element 10 and the hydrophobic layer 8 formed on the organic layer 9 by the modification of the organic layer 9.

In an embodiment, the organic layer 9 may be formed to be shorter than the length of the light emitting element 10. Thus, both sides of the light emitting element 10, e.g., both sides of the second insulating film 170 of the light emitting element 10 may be exposed to an outside of the organic layer 9. As described above, the light emitting element 10 may be aligned between the first electrode 31 and the second electrode 32, and the organic layer 9 may be formed on the light emitting element 10 between the first electrode 31 and the second electrode 32, and may be formed to extend parallel to the first electrode 31 and the second electrode 32.

FIGS. 4B and 5B illustrate an example in which the party wall component 20 is provided on the substrate 5, and the organic layer 9 is further formed on the light emitting element 10. The detailed description of the components of this embodiment is as described with reference to FIGS. 2B, 3B, 4A, and 5A.

FIGS. 6A to 6M are schematic cross-sectional views for explaining a method of manufacturing a pixel structure in accordance with an embodiment of the present disclosure. FIGS. 6A to 6M illustrate the method of manufacturing the pixel structure in accordance with an embodiment having no party wall component 20. However, the following manufacturing method may also be applied to the method of manufacturing the pixel structure in accordance with an embodiment having the party wall component 20.

Figure 6A:
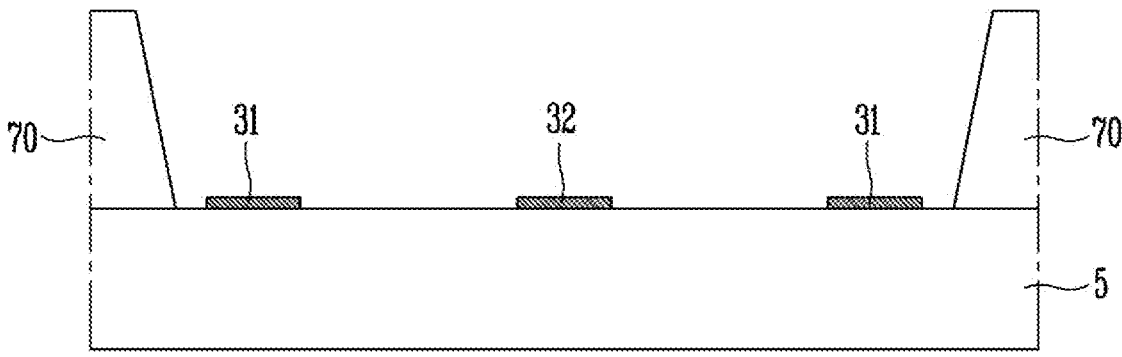
FIGS. 6A to 6M are schematic cross-sectional views illustrating a process of manufacturing a pixel structure in accordance with an embodiment of the present disclosure.

Referring to FIG. 6A, the first and second electrodes 31 and 32 may be formed on the substrate 5 to be spaced apart from each other at a preset interval. The dam structure 70 may be formed outside the first and second electrodes 31 and 32. The dam structure 70 may be made of organic matter as a material capable of maintaining a predetermined thickness. For example, the dam structure 70 may be formed of polyimide, but the present disclosure is not limited thereto.

In various embodiments, the dam structure 70 may be provided before or after the first and second electrodes 31 and 32 are formed.

Figure 6B:
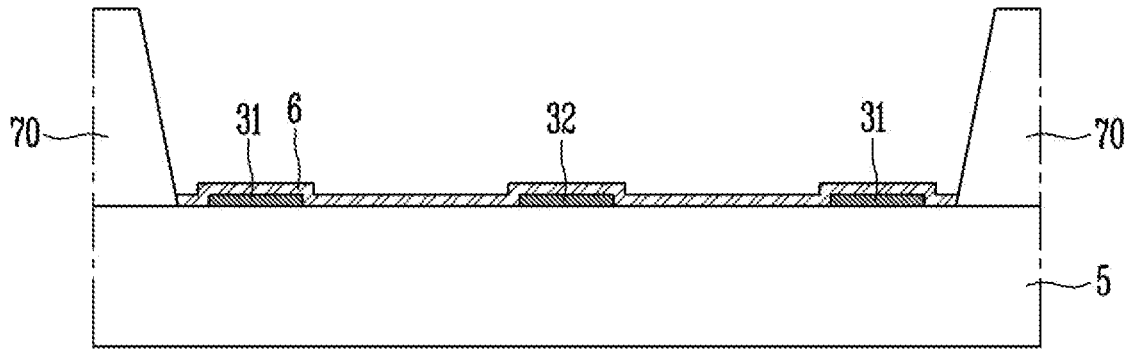

Referring to FIG. 6B, the insulating layer 6 may be applied to the entire surface of the substrate 5 on which the first and second electrodes 31 and 32 are formed. The insulating layer 6 may be formed of an inorganic layer such as silicon oxide, silicon nitride, or metal oxide.

Figure 6C:
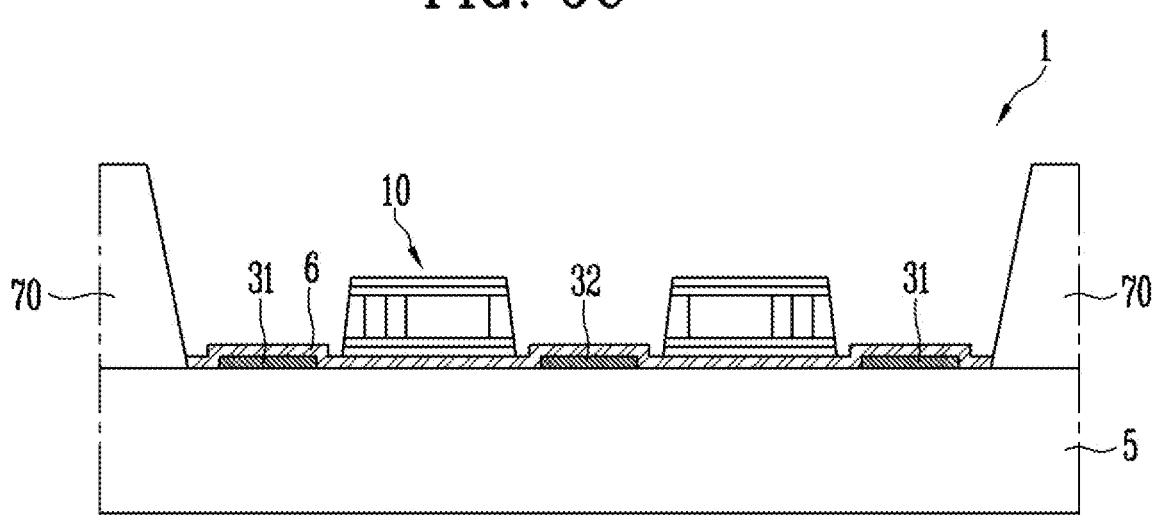

Referring to FIG. 6C, the light emitting element 10 is introduced and aligned on the substrate 5 on which the insulating layer 6 is provided. In an embodiment, a solution containing light emitting elements 10 may be applied onto the substrate 5. Here, the dam structure 70 may prevent the applied solution from overflowing an area of the pixel structure 1. A solvent of the solution may include at least one of acetone, water, isopropyl alcohol (IPA) and toluene, but is not limited thereto. The solvent may be any of various solvents including a volatile material.

After the solution is applied, a voltage may be applied such that an electric field is formed between the first electrode 31 and the second electrode 32. The light emitting element 10 may be aligned between the first electrode 31 and the second electrode 32 by an electric field formed between the first electrode 31 and the second electrode 32. For example, both ends of the light emitting element 10 may be aligned to face the first electrode 31 and the second electrode 32, respectively.

In a state where the light emitting element 10 is aligned, the solvent of the solution may be eliminated. For example, the solvent may be removed by evaporation.

Figure 6D:
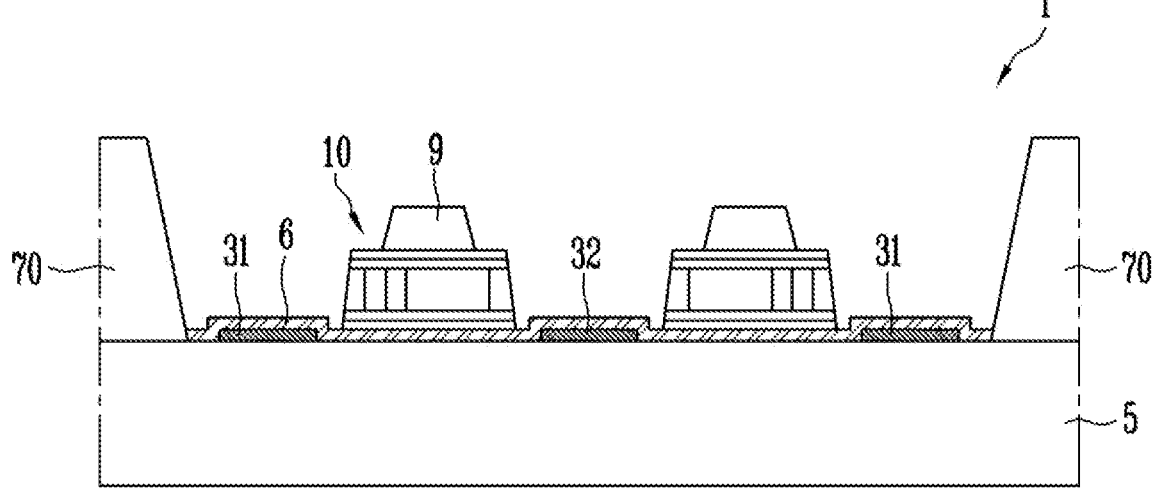

In various embodiments of the present disclosure, as illustrated in FIG. 6D, the organic layer 9 may be further formed on the light emitting element 10. The organic layer 9 may be an organic material that may be modified at a portion of a surface thereof to have hydrophobicity by surface treatment that will be described below, for example, polypropylene (PP), polystyrene (PS), polymethylmethacrylate (PMMA), polyethene (PE), polyamide (PA), polyester, or polytetrafluoroethene (PTFE) and the like. The organic layer 9 may be formed on the light emitting element 10 by a method such as masking after coating the organic material on the substrate 5 on which the light emitting element 10 is aligned and then drying the organic material.

Figure 6E:
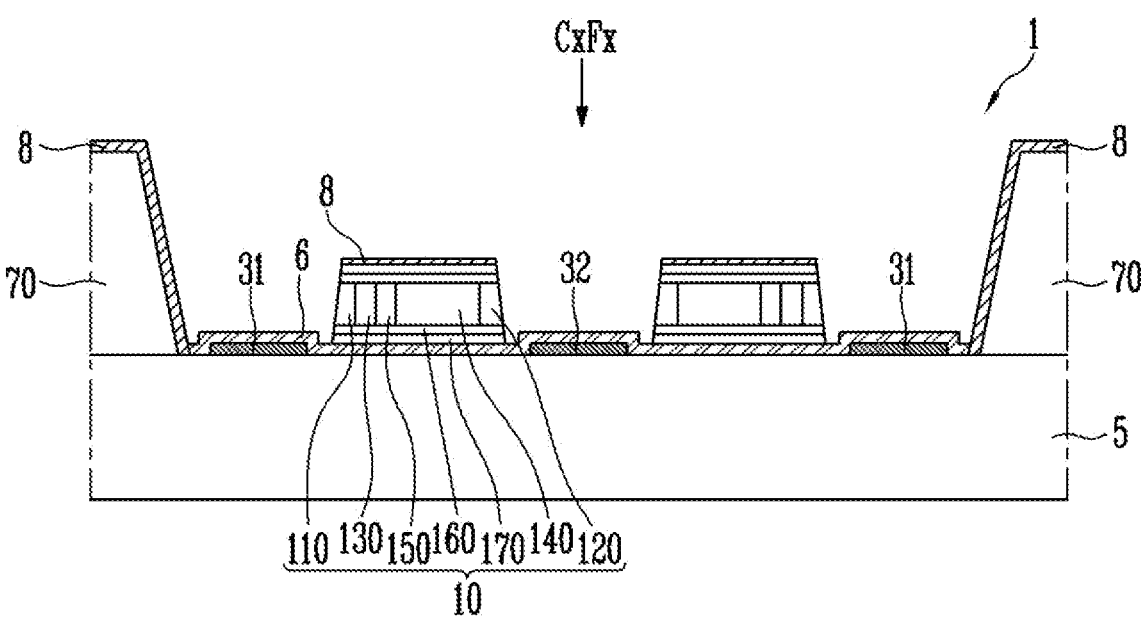

Referring to FIG. 6E, the substrate 5 on which the light emitting element 10 is aligned may be subjected to the surface treatment. For the surface treatment, CxFx-based gas is applied to the substrate 5 on which the light emitting elements 10 are aligned. The gas applied to the substrate 5 chemically reacts with the organic polymer, thus modifying the organic matter formed of the organic polymer to have hydrophobicity. In FIG. 6D, since the second insulating film 170 and the dam structure 70 formed on an outermost surface of the light emitting element 10 are formed of organic matter, a portion of the surface may be modified to have hydrophobicity by surface treatment, thereby forming the hydrophobic layer 8. Since the insulating layer 6 covering a remaining area except for the light emitting element 10 and the dam structure 7 is formed of an inorganic layer, it may not react with gas applied to the substrate 5.

Figure 6F:
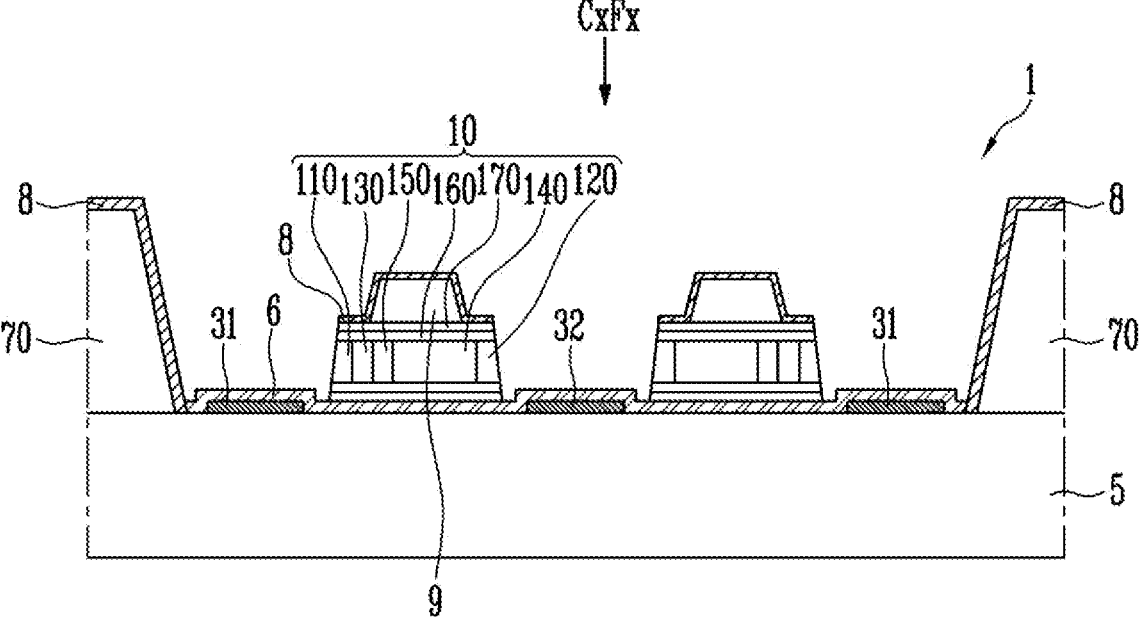

In an embodiment where the organic layer 9 is formed on the light emitting element 10, as illustrated in FIG. 6F, the hydrophobic layer 8 may be formed on the surface of the organic layer 9 by the surface treatment. In an embodiment, in case that the length of the organic layer 9 is formed to be shorter than the length of the light emitting element 10, both sides of the second insulating film 170 of the light emitting element 10 exposed to the outside of the organic layer 9 may be subjected to surface treatment, thus forming the hydrophobic layer 8.

Figure 6G:
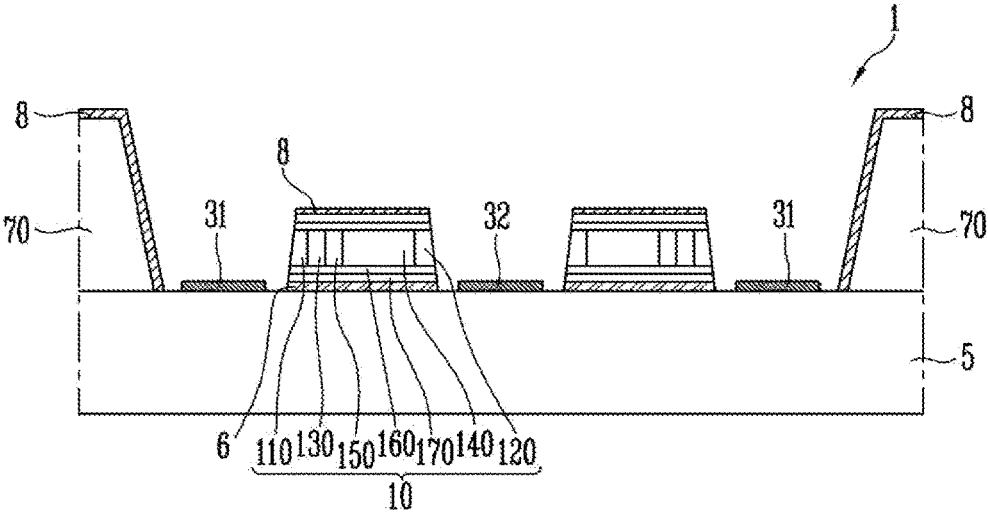
Figure 6H:
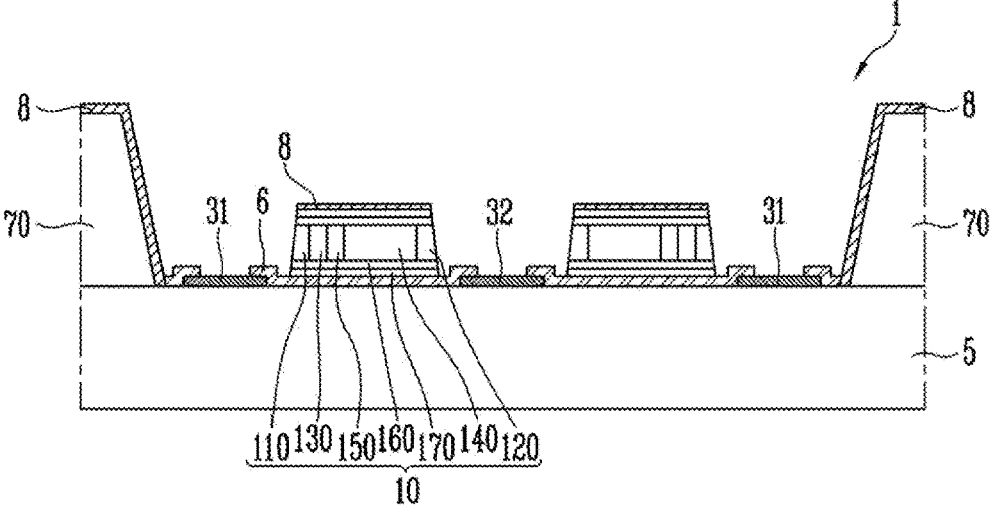
Figure 6I:
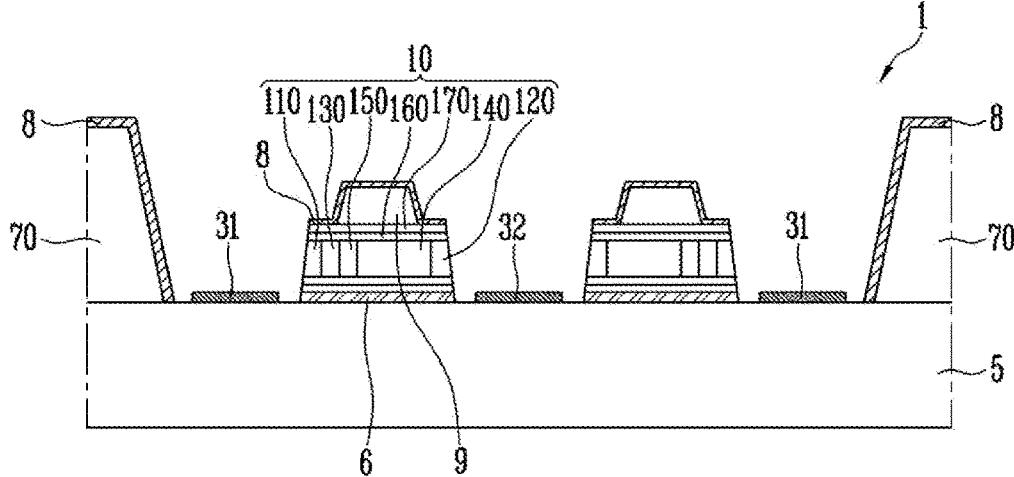
Figure 6J:
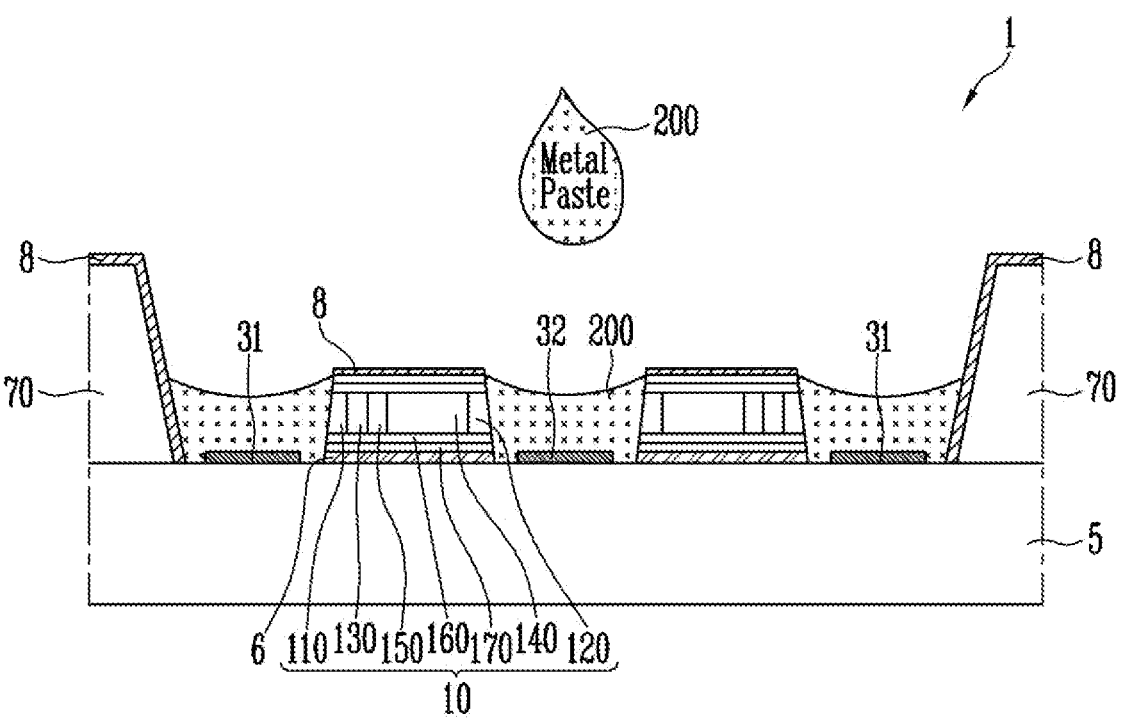

Referring to FIGS. 6G to 6I, at least a portion of the insulating layer 6 may be removed from the substrate 5 that is surface-treated. Here, a portion of the insulating layer 6 formed below the light emitting element 10 may not be removed. FIG. 6G to 6I illustrate that the insulating layer 6 is removed from areas other than a lower portion of the light emitting element 10. However, the insulating layer 6 may not be removed from some areas, for example, a portion on the first and second electrodes 31 and 32, and/or an area between each of the first and second electrodes 31 and 32 and the dam structure 70, etc. For example, in an embodiment, as illustrated FIG. 6H, the insulating layer 6 may be removed from only a central area of each of the first and second electrodes 31 and 32 and may not be removed from the remaining area.

Figure 6K:
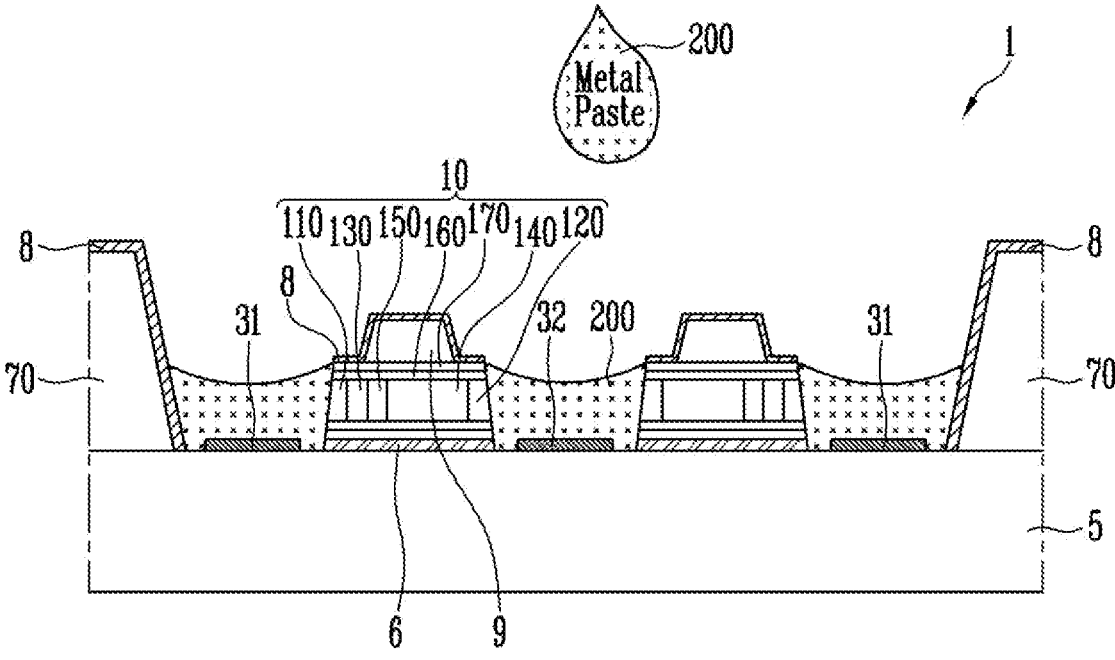

Referring to FIGS. 6F and 6K, a first coupling electrode 41 and a second coupling electrode 42 are formed to electrically connect the light emitting element 10 with the first and second electrodes 31 and 32 on the substrate 5 from which the insulating layer 6 is removed.

In various embodiments of the present disclosure, metal paste 200 made of metal, such as silver, aluminum, gold, or lead, in a paste state is applied to the substrate 5 from which the insulating layer 6 has been removed. In various embodiments, the metal paste 200 having the metal content of about 50% to about 70% may be used. The metal paste 200 may be applied in an inkjet or nozzle jetting method. The metal paste 200 may be applied or dropped onto the substrate 5. In an embodiment, the metal paste 200 may be applied in a capacity so that it does not overflow onto the light emitting element 10. As illustrated in FIG. 6K, in case that the organic layer 9 is formed on the light emitting element 10, the metal paste 200 may be applied in a capacity so that it does not overflow onto the organic layer 9. In an embodiment, about 1 to about 10 picoliters of the metal paste 200 may be applied onto the substrate 5.

In an embodiment, the metal paste 200 may be generally applied to an area where the hydrophobic layer 8 is not formed. Even if the metal paste 200 is applied to the entire substrate 5 including the area where the hydrophobic layer 8 is formed, the metal paste 200 is not compatible with the hydrophobic layer 8, so that the metal paste may be more easily applied to the area where the hydrophobic layer 8 is not formed. Consequently, the metal paste 200 may be applied separately to the left and right sides of the light emitting element 10 between the dam structures 70.

Figure 6L:
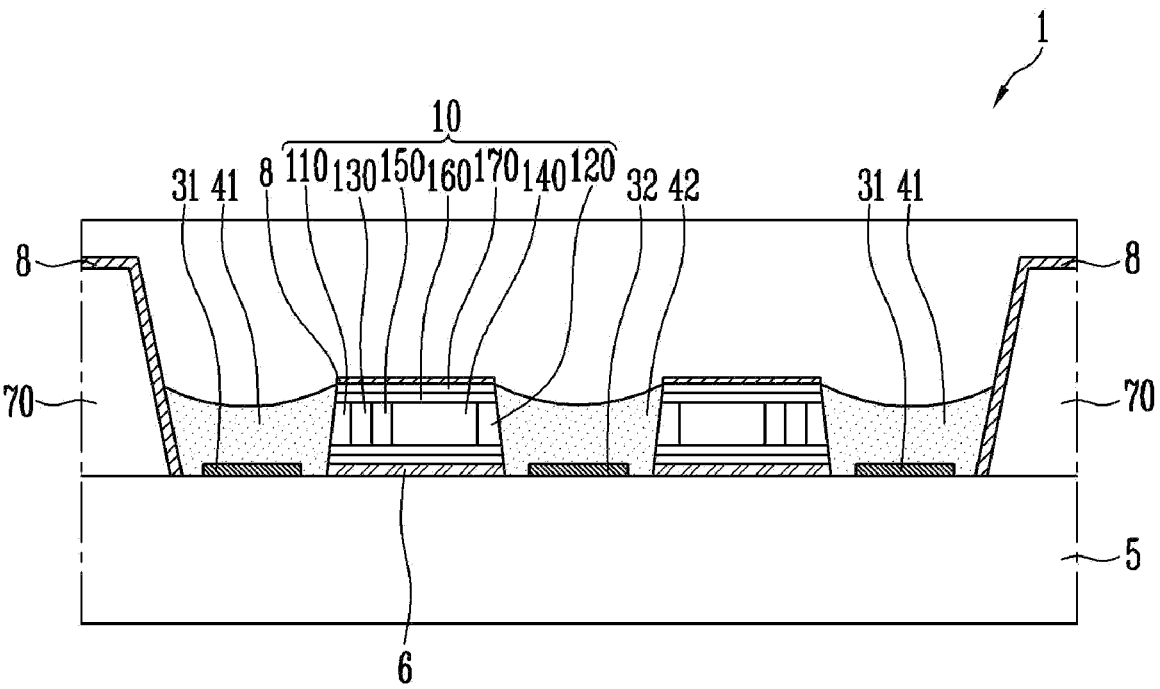
Figure 6M:
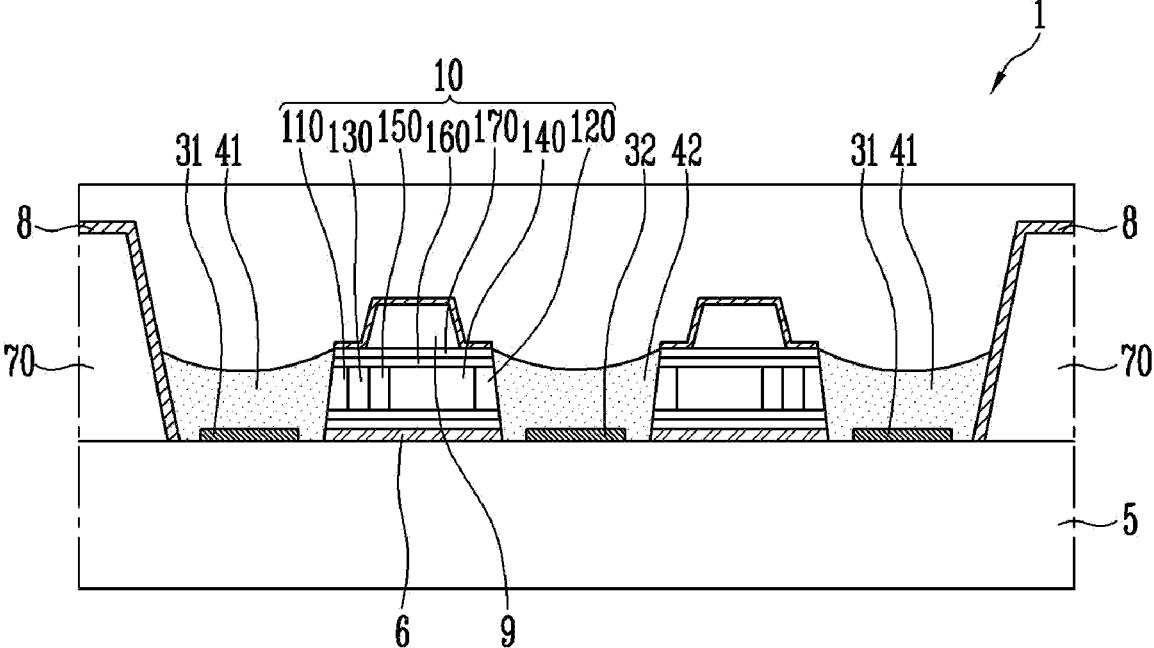

Referring to FIGS. 6L and 6M, the metal paste 200 may be dried and formed in a compressed shape towards the first electrode 31, the second electrode 32, and the substrate 5 provided therebelow.

The metal paste 200 remaining between the light emitting element 10 and the left dam structure 70 forms the first coupling electrode 41 that electrically connects the first electrode 31 with the light emitting element 10. The metal paste 200 remaining between the light emitting element 10 and the left dam structure 70 forms the second coupling electrode 42 that electrically connects the second electrode 32 with the light emitting element 10.

The present disclosure has the advantage that the coupling electrode component 40 may be formed without a separate mask through a simpler process, thus lowering the complexity of the process and reducing a failure rate.

Figure 7:
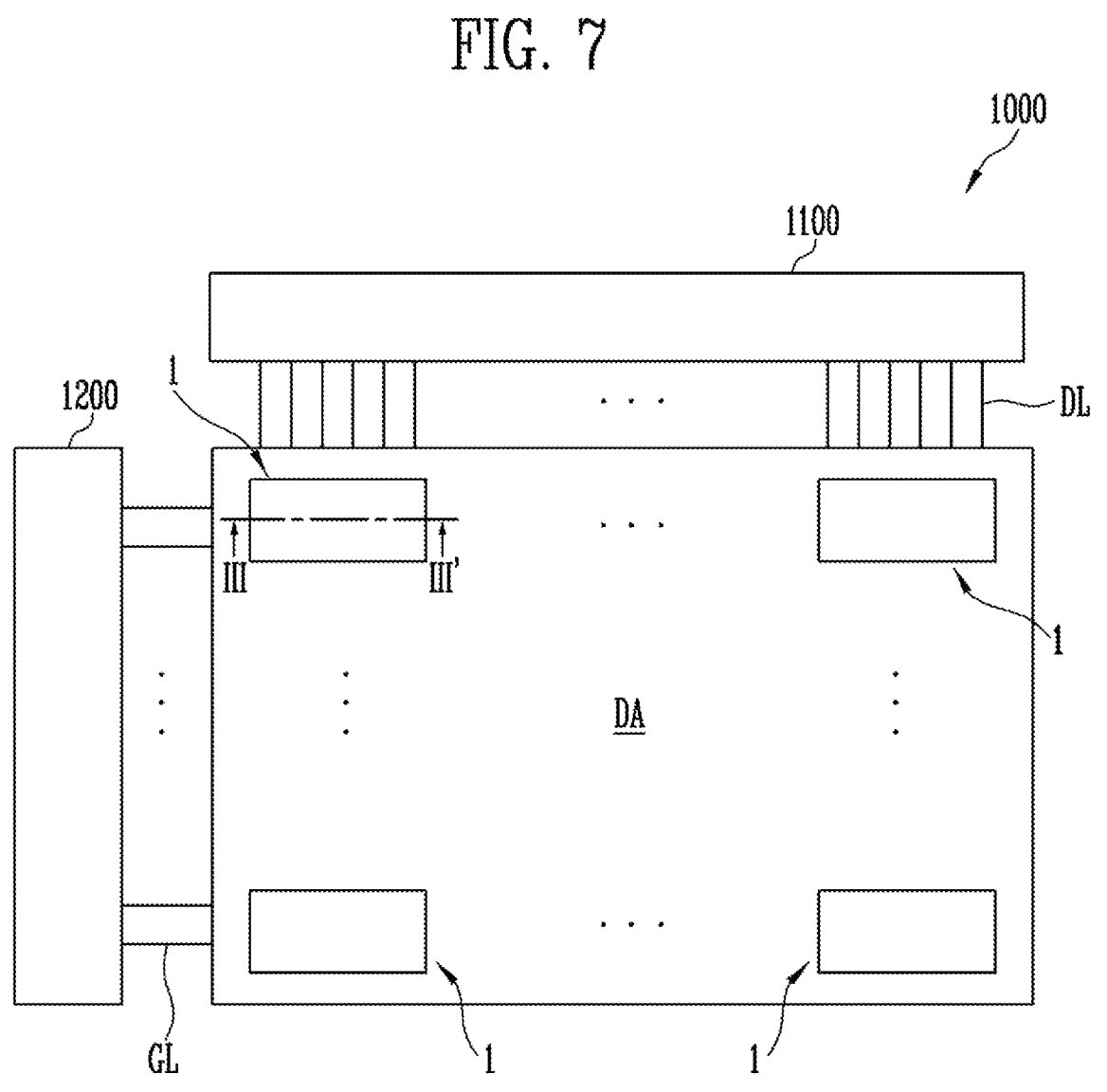

FIG. 7 is a schematic plan view conceptually illustrating a display device including a pixel structure in accordance with an embodiment of the present disclosure.

Referring to FIG. 7, the display device 1000 includes pixel structures 1 according to the above-described embodiments and a driving circuit electrically connected to the pixel structures 1.

The pixel structures 1 may be disposed in a display area DA of the display device 1000. The driving circuit may be disposed in a non-display area disposed outside the display area DA of the display device 1000. The driving circuit includes a data driving circuit 1100 and a gate driving circuit 1200. In an embodiment, the pixel structure 1 may form a pixel or a sub-pixel.

The data driving circuit 1100 includes source drive integrated circuits (ICs) to drive data lines DL. The gate driving circuit 1200 includes one or more gate drive ICs to supply a scan pulse to gate lines GL.

The display device 1000 is classified into a passive matrix type display device and an active matrix type display device according to a method of driving light emitting elements 10. For instance, in case that the display device 1000 is implemented in the active matrix type, the pixel structure 1 may include a first transistor as a driving transistor that controls an amount of current supplied to the light emitting element 10, and a second transistor as a switching transistor that transmits data voltage to the first transistor, as in the above-described embodiment. Recently, the active matrix type display device selectively turning on each unit pixel in view of resolution, contrast, and operating speed has been mainstreamed. However, the present disclosure is not limited thereto. The passive matrix type display device turning on a pixel group may also use the electrode arrangement of the present disclosure.

Figure 8:
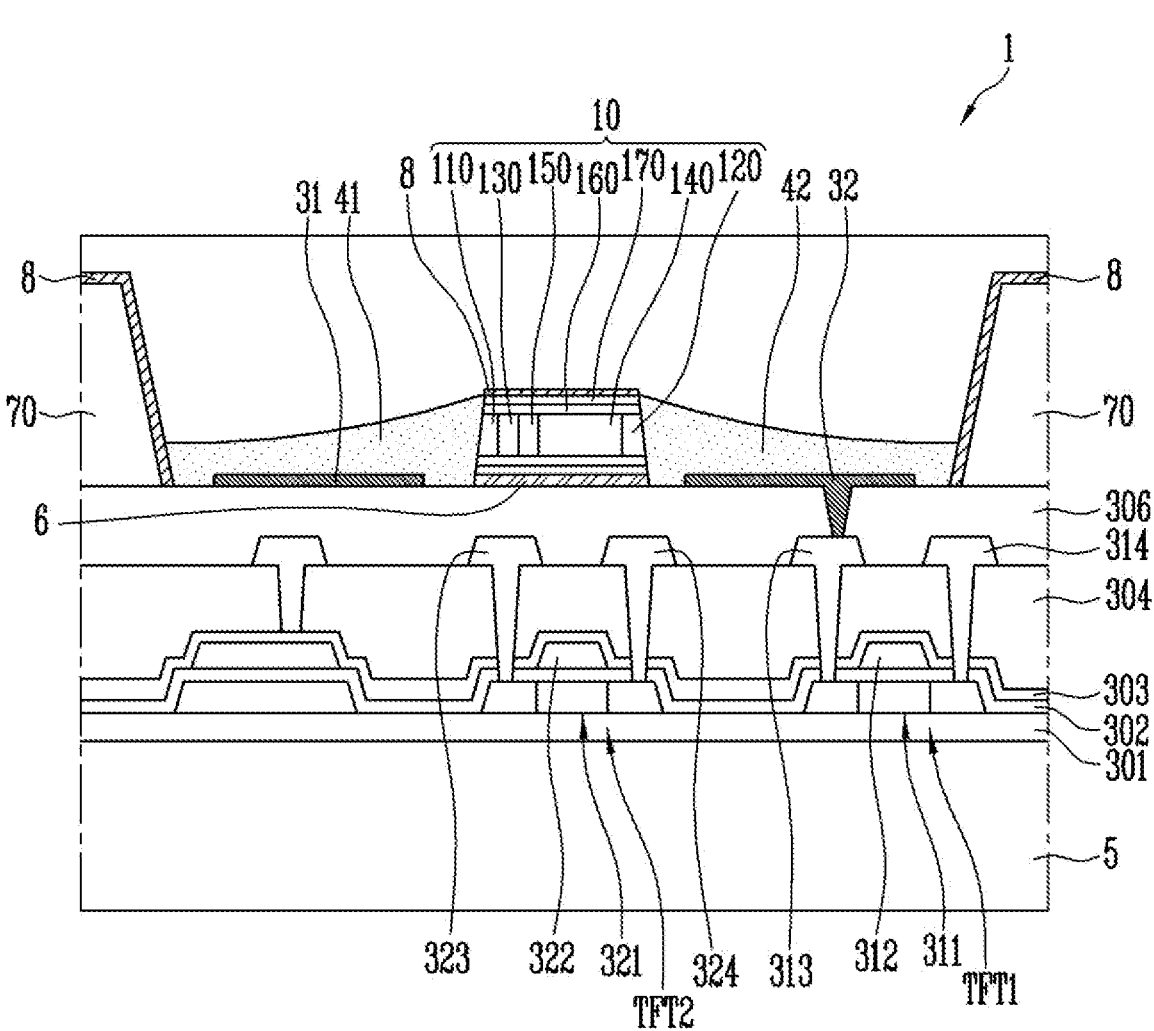
FIGS. 8 and 9 are schematic cross-sectional views of the display device taken along line III-III' of FIG. 7.
Figure 9:
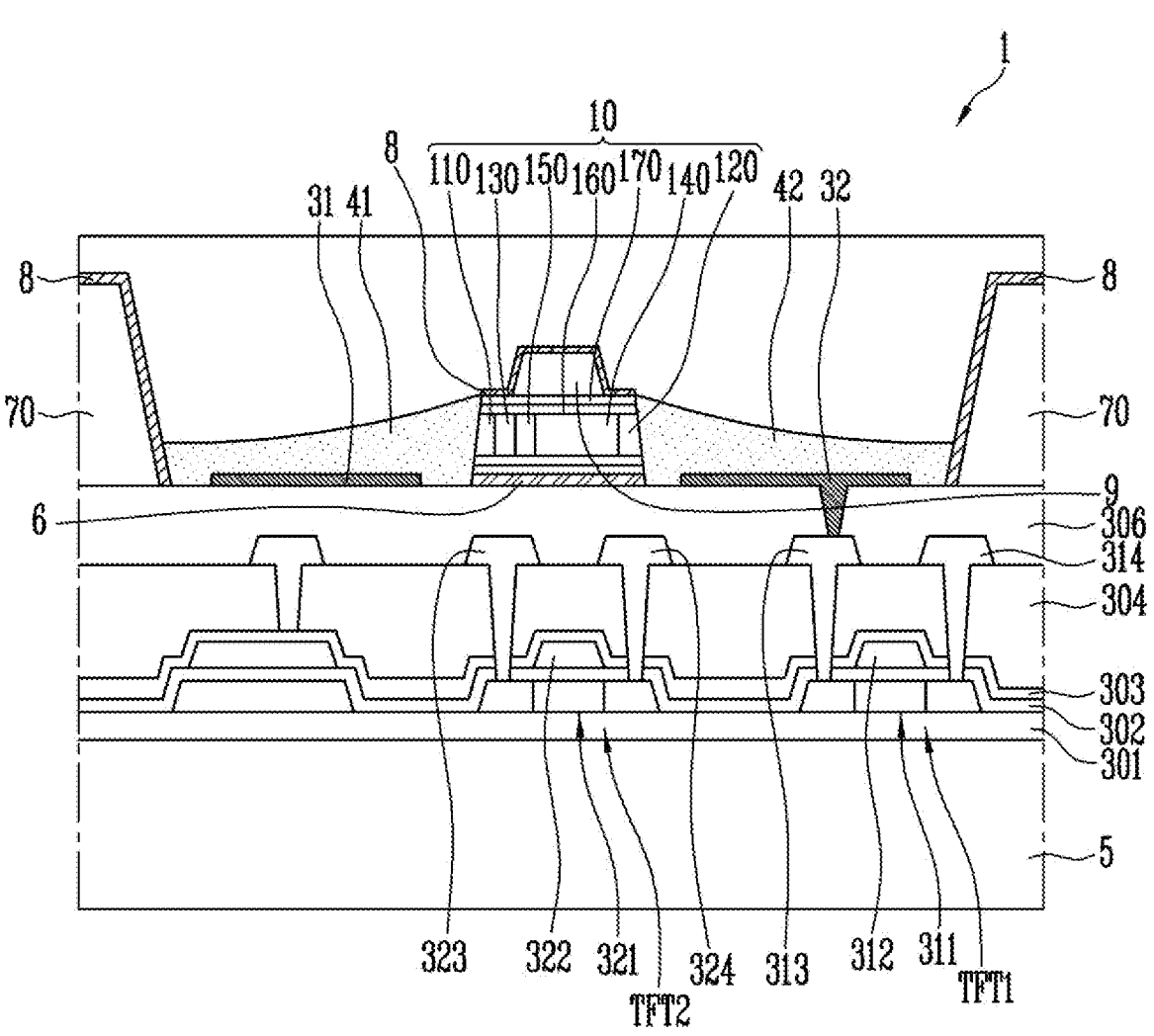

FIGS. 8 and 9 are schematic cross-sectional views of the display device taken along line III-III' of FIG. 7. FIGS. 8 and 9 are diagrams for explaining the pixel structure 1 in case that the display device 1000 is the active matrix type. For the convenience of explanation, FIGS. 8 and 9 illustrate an example where one first electrode 31 and one second electrode 32 are disposed between the dam structures 70. However, embodiments of the present disclosure are not limited thereto. As described in FIGS. 2 to 6, the pixel structure 1 of the display device 1000 may be configured to include one or more first electrodes 31 and one or more second electrodes 32 between the dam structures 70.

Referring to FIGS. 8 and 9, the pixel structure 1 includes a party wall component 20 disposed on a substrate 5, an electrode component 30, a light emitting element 10, and a coupling electrode component 40. A dam structure 70 may be disposed outside the electrode component 30.

A first electrode 31 and a second electrode 32 may be provided on the substrate 5. The first electrode 31 and the second electrode 32 may be disposed on the substrate 5 to be spaced apart from each other by a predetermined distance.

The substrate 5 may be any one of a glass substrate, a crystal substrate, a sapphire substrate, a plastic substrate, and a flexible polymer film that may be bent, but the present disclosure is not limited thereto.

Each of the first electrode 31 and the second electrode 32 may be formed in a rectangular shape. However, embodiments the present disclosure are not limited thereto. Each of the first electrode 31 and the second electrode 32 may have any of various shapes such as a trapezoid inclined at a predetermined angle, a semi-circle, a semi-ellipse, and a circle. In various embodiments of the present disclosure, one of the first and second electrodes 31 and 32 may be an anode electrode, while the other may be a cathode electrode.

The light emitting element 10 is disposed between the first electrode 31 and the second electrode 32. The specific structure of the light emitting element 10 has been described above with reference to FIG. 1.

The insulating layer 6 may be disposed below or under the light emitting element 10. The insulating layer 6 may be formed of an inorganic layer such as silicon oxide, silicon nitride, or metal oxide. The insulating layer 6 may be formed during a process for aligning the light emitting element 10.

The coupling electrode component 40 includes a first coupling electrode 41 electrically connecting the light emitting element 10 with the first electrode 31, and a second coupling electrode 42 stably electrically connecting the light emitting element 10 with the second electrode 32. The first coupling electrode 41 electrically contacts and connects the first electrode layer 110 of the subminiature light emitting element 30 with the first electrode 31, while the second coupling electrode 42 electrically contacts and connects the second electrode layer 120 of the subminiature light emitting element 30 with the second electrode 32.

The dam structure 70 may be disposed outside the first and second electrodes 31 and 32. The dam structure 70 may be formed to be higher than the height of the first and second electrodes 31 and 32. The dam structure 70 may prevent solution containing light emitting elements 10 or metal paste 200 for forming the coupling electrode component 40 from shifting to an undesired area in the process of manufacturing the pixel structure 1.

The dam structure 70 may be made of organic matter as a material capable of maintaining a predetermined thickness. For example, the dam structure 70 may be formed of polyimide, but the present disclosure is not limited thereto.

In various embodiments of the present disclosure, a hydrophobic layer 8 may be formed above (or on) the light emitting element 10 and the dam structure 70. The hydrophobic layer 8 may be formed by treating the surface of the pixel structure 1 during the process and then chemically modifying a portion of surfaces of the second insulating film 170 of the light emitting element 10 and the dam structure 70.

Although not illustrated in the drawings, in various embodiments, at least one insulating layer and/or an overcoat layer may be provided on the first and second coupling electrodes 41 and 42. The insulating layer and/or the overcoat layer may be a flattening layer that reduces a height difference in upper surfaces caused by the party wall component 20, the electrode component 30, the light emitting element 10, and the coupling electrode component 40 that are disposed therebelow. The insulating layer and/or the overcoat layer may be an encapsulation layer to prevent oxygen and moisture from penetrating into the light emitting elements 10.

Referring to FIG. 9, the pixel structure 1 may further include an organic layer 9 that is formed on the light emitting element 10. The organic layer 9 may be made of organic material such as polypropylene (PP), polystyrene (PS), polymethylmethacrylate (PMMA), polyethene (PE), polyamide (PA), polyester, or polytetrafluoroethene (PTFE), for example. Thus, a portion of a surface of the organic layer 9 may be converted into hydrophobicity by the above-described surface treatment to form a hydrophobic layer 8.

A first thin-film transistor TFT1 includes a first active layer 311, a first gate electrode 312, a first drain electrode 313, and a first source electrode 314. A first gate insulating layer 302 may be interposed between the first gate electrode 312 and the first active layer 311 to insulate them from each other. The first gate electrode 312 is formed on the first gate insulating layer 302 to overlap a portion of the first active layer 311. The first thin-film transistor TFT1 may be a driving thin-film transistor which is disposed below or under the light emitting element 10 to drive the light emitting element 10.

A second thin-film transistor TFT2 includes a second active layer 321, a second gate electrode 322, a second drain electrode 323, and a second source electrode 324. A first gate insulating layer 302 may be interposed between the second gate electrode 322 and the second active layer 321 to insulate them from each other. The second gate electrode 322 is formed on the first gate insulating layer 302 to overlap a portion of the second active layer 321.

The first active layer 311 and the second active layer 321 may be provided on a buffer layer 301. The first active layer 311 and the second active layer 321 may include an inorganic semiconductor, such as amorphous silicon or poly silicon, or an organic semiconductor. In some embodiments, the first active layer 311 may be formed of an oxide semiconductor. For example, the oxide semiconductor may include group 12, 13, and 14 metal elements such as zinc (Zn), indium (In), gallium (Ga), tin (Sn) cadmium (Cd), germanium (Ge), or hafnium (Hf), and oxides of materials selected from combinations thereof.

The first gate insulating layer 302 is provided on the buffer layer 301 to cover the first active layer 311 and the second active layer 321. The second gate insulating layer 303 is formed to cover the first gate electrode 312 and the second gate electrode 322. The first gate electrode 312 and the second gate electrode 322 may include a single layer structure or a multiple layer structure such as Au, Ag, Cu, Ni, Pt, Pd, Al, Mo, or Cr, or may include alloys such as Al:Nd or Mo:W. The first gate insulating layer 302 and the second gate insulating layer 303 may include an inorganic layer such as silicon oxide, silicon nitride, or metal oxide, and may be formed in a single layer or a multiple layer.

An interlayer insulating layer 304 is formed on the second gate insulating layer 303. The interlayer insulating layer 304 may be formed of an inorganic layer such as silicon oxide or silicon nitride. The interlayer insulating layer 304 may include an organic layer.

The first drain electrode 313 and the first source electrode 314 are formed on the interlayer insulating layer 304. Each of the first drain electrode 313 and the first source electrode 314 is in electrical contact with the first active layer 311 through contact holes. The second drain electrode 323 and the second source electrode 324 are formed on the interlayer insulating layer 304, and each of the second drain electrode 323 and the second source electrode 324 is in electrical contact with the second active layer 321 through the contact holes. The first drain electrode 313, the second drain electrode 323, the first source electrode 314, and the second source electrode 321 may include metal, alloy, metal nitride, conductive metal oxide, transparent conductive material, or the like.

The structure of the above-described thin film transistor TFT is not necessarily limited thereto, and thin film transistors of various types may be used. For example, the thin film transistor TFT may be formed in a top gate structure and may be formed in a bottom gate structure where the first gate electrode 312 is disposed below the first active layer 311.

A planarization layer 306 covers the first and second thin-film transistors TFT1 and TFT2 and is provided on the interlayer insulating layer 304. The planarization layer 306 may serve to eliminate the height difference in the layers and may planarize the upper surface(s) of the layer so as to increase the luminous efficiency of the light emitting element 10 that is to be formed on the planarization layer. The planarization layer 306 may have a through hole that exposes a portion of the first drain electrode 313.

The planarization layer 306 may be formed of insulating material. For example, the planarization layer 306 may be formed in a single-layer structure or a multi-layer structure of inorganic matter, organic matter, or organic/inorganic composites, and may be formed by various deposition methods. In some embodiments, the planarization layer 306 may be formed of one or more materials among polyacrylate-based resin, epoxy resin, phenolic resin, polyamide-based resin, polyimide-based resin, unsaturated polyesters resin, polyphenylen ether-based resin, polyphenylene sulfide-based resin, or benzocyclobutene (BCB).

However, the embodiment according to the present disclosure is not limited to the above-described structure. In some cases, either of the planarization layer 306 and the interlayer insulating layer 304 may be omitted.

The first electrode 31 is an electrode that is disposed above the interlayer insulating layer 304 to be electrically connected to the light emitting element 10.

The second electrode 32 is an electrode that is disposed above the interlayer insulating layer 306 to be electrically connected to the light emitting element 10. The second electrode 32 may be electrically connected to a power line 313. For instance, a planarization layer 304 may be disposed below the power line 313 to planarize a surface. However, the planarization layer 304 is not an essential component, and may not be provided if desired.

It will be understood to those skilled in the art that the present disclosure may be implemented in different specific forms without changing the technical ideas or essential characteristics. Therefore, it should be understood that the exemplary embodiments are only for illustrative purposes and do not limit the bounds of the present invention. It is intended that the bounds of the present disclosure are defined by the accompanying claims, and various modifications, additions and substitutions, which can be derived from the meaning, scope and equivalent concepts of the accompanying claims, fall within the bounds of the present disclosure.

The invention claimed is:

1. A light emitting device, comprising:
   a first semiconductor layer;
   an active layer disposed on the first semiconductor layer;
   a second semiconductor layer disposed on the active layer;
   a first insulating film surrounding an outer surface of at least one of the first semiconductor layer, the second semiconductor layer, and the active layer;
   a second insulating film surrounding an outer surface of the first insulating film; and
   a hydrophobic layer disposed on at least a portion of a surface of the second insulating film,
   wherein the hydrophobic layer is formed to cover an entire upper surface of the second insulating film.

2. The light emitting device according to claim 1, wherein the second insulating film comprises an organic polymer material.

3. The light emitting device according to claim 1, wherein the second insulating film comprises at least one of polypropylene (PP), polystyrene (PS), polymethylmethacrylate (PMMA), polyethene (PE), polyamide (PA), polyester, and polytetrafluoroethene (PTFE).

4. A pixel structure, comprising:
   a substrate;
   an electrode component comprising a first electrode disposed on the substrate, and
   a second electrode disposed on a same plane as the first electrode to be spaced apart therefrom;
   a light emitting device aligned between the first electrode and the second electrode; and
   a coupling electrode component including a transparent conductive material and comprising:

a first coupling electrode that is disposed on the first electrode and electrically connects a first distal end of the light emitting device with the first electrode; and a second coupling electrode that is disposed on the second electrode and electrically connects a second distal end of the light emitting device with the second electrode, wherein the light emitting device comprises:

a first semiconductor layer;

an active layer disposed on the first semiconductor layer;

a second semiconductor layer disposed on the active layer;

a first insulating film surrounding an outer surface of at least one of the first semiconductor layer, the second semiconductor layer, and the active layer;

a second insulating film surrounding an outer surface of the first insulating film; and a first hydrophobic layer disposed on an exposed surface of the second insulating film of the light emitting device, and wherein the first coupling electrode and the second coupling electrode do not cover an upper side of the light emitting device, wherein the first distal end and the second distal end face each other, wherein an upper surface of the first coupling electrode and an upper surface of the second coupling electrode are disposed lower than the upper side of the light emitting device, and wherein each of a first end of the light emitting device and a second end of the light emitting device opposite to the first end are spaced apart from both of the first electrode and the second electrode.

5. The pixel structure according to claim 4, further comprising:

an organic layer disposed on the light emitting device.

6. The pixel structure according to claim 5, further comprising:

a second hydrophobic layer disposed on a surface of the organic layer.

7. The pixel structure according to claim 6, further comprising:

a dam structure disposed outside the first and second electrodes and including an organic material.

8. The pixel structure according to claim 7, further comprising:

a third hydrophobic layer disposed on a surface of the dam structure.

9. The pixel structure according to claim 8, wherein the first coupling electrode and the second coupling electrode are disposed in an area where the first, second, and third hydrophobic layers are not disposed.

10. The pixel structure according to claim 5, further comprising:

an insulating layer disposed between the substrate and the light emitting device and including an inorganic material.

11. A method of manufacturing a pixel structure, comprising:

forming a first electrode and a second electrode on a substrate to be spaced apart from each other;

forming a dam structure outside the first electrode and the second electrode, the dam structure being formed of organic material;

forming an insulating layer on the first electrode and the second electrode, the insulating layer being formed of inorganic material;

aligning a light emitting device between the first electrode and the second electrode;

plasma-treating the substrate on which the light emitting device is aligned to generate a plasma-treated substrate;

removing at least a portion of the insulating layer; and forming a first coupling electrode and a second coupling electrode that electrically connect the light emitting device to the first electrode and the second electrode, respectively, wherein the light emitting device comprises:

a first semiconductor layer;

an active layer disposed on the first semiconductor layer:

a second semiconductor layer disposed on the active layer;

a first insulating film surrounding an outer surface of at least one of the first semiconductor layer, the second semiconductor layer, and the active layer;

a second insulating film surrounding an outer surface of the first insulating film; and a hydrophobic layer disposed on at least a portion of a surface of the second insulating film, and wherein the hydrophobic layer is formed to cover an entire upper surface of the second insulating film.

12. The method according to claim 11, wherein in the plasma-treating, a gas containing fluorine is used.

13. The method according to claim 12, further comprising:

forming an organic layer on the light emitting device after the aligning of the light emitting device.

14. The method according to claim 13, wherein a second hydrophobic layer is formed on a surface of the organic layer by the plasma treatment.

15. The method according to claim 14, wherein a third hydrophobic layer is formed on a surface of the dam structure by the plasma treatment.

16. The method according to claim 15, wherein the forming of the first coupling electrode and the second coupling electrode comprises:

applying metal paste on the plasma-treated substrate; and drying the metal paste, wherein the metal paste is not compatible with the first, second, and third hydrophobic layers, and is applied to an area in which the first, second, and third hydrophobic layers are not formed.

17. The pixel structure of claim 4, wherein a length corresponding to a longest dimension of the light emitting device is less than a distance between the first electrode and the second electrode.

18. A pixel structure, comprising:

a substrate:

an electrode component comprising a first electrode disposed on the substrate, and a second electrode disposed on a same plane as the first electrode to be spaced apart therefrom;

a light emitting device aligned between the first electrode and the second electrode; and a coupling electrode component including a transparent conductive material and comprising:

a first coupling electrode that is disposed on the first electrode and electrically connects a first distal end of the light emitting device with the first electrode; and a second coupling electrode that is disposed on the second electrode and electrically connects a second distal end of the light emitting device with the second electrode, wherein the light emitting device comprises:

a first semiconductor layer:

an active layer disposed on the first semiconductor layer:

a second semiconductor layer disposed on the active layer;

a first insulating film surrounding an outer surface of at least one of the first semiconductor layer, the second semiconductor layer, and the active layer;

a second insulating film surrounding an outer surface of the first insulating film; and a first hydrophobic layer disposed on an exposed surface of the second insulating film of the light emitting device, wherein the first coupling electrode and the second coupling electrode do not cover an upper side of the light emitting device, wherein the first distal end and the second distal end face each other, wherein an upper surface of the first coupling electrode and an upper surface of the second coupling electrode are disposed lower than the upper side of the light emitting device, and wherein the first hydrophobic layer is disposed only on a portion of the second insulating film that faces away from the substrate, and wherein the second insulating film surrounds an outer circumferential surface of the first insulating film.

* * * * *